(12) United States Patent
Shende

(10) Patent No.: US 12,716,537 B2
(45) **Date of Patent: *Aug. 25, 2026**

(54) BLIND MATE COUPLING WITH A SELF CENTERING MECHANISM

(71) Applicant: Danfoss A/S, Nordborg (DK)

(72) Inventor: Amit Ramesh Shende, Pimpri (IN)

(73) Assignee: DANFOSS A/S, Nordborg (DK)

( * ) Notice: Subject to any disclaimer, the term of this patent is extended or adjusted under 35 U.S.C. 154(b) by 0 days.

This patent is subject to a terminal disclaimer.

(21) Appl. No.: 18/943,346

(22) Filed: Nov. 11, 2024

(65) Prior Publication Data

US 2025/0067378 A1 Feb. 27, 2025

Related U.S. Application Data

(63) Continuation of application No. 18/547,968, filed as application No. PCT/IB2022/051643 on Feb. 24, 2022, now Pat. No. 12,173,826.

(30) Foreign Application Priority Data

Feb. 26, 2021 (IN) ............................ 202111008145

(51) Int. Cl.
*F16L 37/52* (2006.01)
*F16L 29/04* (2006.01)
(Continued)

(52) U.S. Cl.
CPC ............... *F16L 37/52* (2013.01); *F16L 29/04* (2013.01); *F16L 37/34* (2013.01); *F16L 37/35* (2013.01); *H05K 7/20272* (2013.01)

(58) Field of Classification Search
CPC . F16L 27/02; F16L 27/04; F16L 37/52; F16L 29/04; F16L 37/32; F16L 37/34; F16L 37/35; H05K 7/20272
See application file for complete search history.

(56) References Cited

U.S. PATENT DOCUMENTS 3,645,294 A * 2/1972 Allread .................. F16L 37/34 137/614
4,886,301 A * 12/1989 Remsburg .............. F16L 37/56 285/39
(Continued)

FOREIGN PATENT DOCUMENTS

CN 102095038 A 6/2011
CN 110582329 A 12/2019
(Continued)

OTHER PUBLICATIONS

International Search Report and Written Opinion for PCT/IB2022/051643, mailed Apr. 25, 2022.

*Primary Examiner* — David Colon-Morales
(74) *Attorney, Agent, or Firm* — Merchant & Gould P.C.

(57) ABSTRACT

Coupling assembly made up of a male fluid coupler and a female fluid coupler for a fluid line. The male and female fluid couplers are closed to flow in the uncoupled state and are open to flow when coupled. The male fluid coupler can include an alignment compensation arrangement that can adjust for any initial misalignment between the male and female fluid couplers. The alignment compensation arrangement can function as a universal connection joint to allow the male fluid coupler to universally pivot and move radially.

20 Claims, 16 Drawing Sheets

(51) Int. Cl.

| | |
|---|---|
| ***F16L 37/34*** | (2006.01) |
| *F16L 37/35* | (2006.01) |
| *H05K 7/20* | (2006.01) |

(56) References Cited

U.S. PATENT DOCUMENTS

| | | | | |
|---|---|---|---|---|
| 5,322,330 | A * | 6/1994 | Remsburg | F16L 37/56 285/39 |
| 6,866,064 | B2 * | 3/2005 | Nanni, Jr. | F16L 37/0887 137/15.09 |
| 7,413,161 | B2 * | 8/2008 | Arosio | F16L 37/413 251/149.6 |
| 8,028,718 | B2 * | 10/2011 | Tiberghien | F16L 29/04 251/149.6 |
| 8,931,499 | B2 * | 1/2015 | Clever | F16L 27/04 137/614.04 |
| 9,016,314 | B2 * | 4/2015 | Eriksen | H05K 7/20763 137/614.04 |
| 9,194,634 | B2 * | 11/2015 | Tiberghien | F16L 37/34 |
| 9,351,428 | B2 * | 5/2016 | Eckberg | F16L 37/34 |
| 10,288,198 | B2 * | 5/2019 | Tiberghien | H05K 7/20272 |
| 10,514,121 | B2 * | 12/2019 | Wada | F16L 37/23 |
| 11,359,753 | B2 * | 6/2022 | Raad | F16L 37/52 |
| 11,746,942 | B2 * | 9/2023 | Durieux | F16L 37/56 251/149.6 |
| 11,815,214 | B2 * | 11/2023 | Nick | H05K 7/20781 |
| 12,044,338 | B2 * | 7/2024 | Durieux | F16L 27/00 |
| 12,173,826 | B2 * | 12/2024 | Shende | F16L 37/367 |
| 12,247,685 | B2 * | 3/2025 | Marquis | F16L 37/52 |
| 2013/0312846 | A1 * | 11/2013 | Eriksen | H05K 7/20772 137/315.01 |
| 2022/0136634 | A1 * | 5/2022 | Gong | H05K 7/20327 361/679.53 |
| 2023/0143344 | A1 * | 5/2023 | Marquis | F16L 37/52 285/261 |
| 2023/0184363 | A1 | 6/2023 | Marquis | |
| 2024/0175531 | A1 * | 5/2024 | Marquis | F16L 37/34 |

FOREIGN PATENT DOCUMENTS

| | | | | |
|---|---|---|---|---|
| DE | 4323758 | A1 * | 4/1994 | F16L 37/36 |
| WO | 2022031918 | A1 | 2/2022 | |

* cited by examiner 100
128
112
116
136c
140
102
126
124
108
130
110
134
122
138
136b
142
136a
132
120
118
168
114
136d
154
164
162
150
166
148
104
170
196
190
106
178
186
172
204
194
192
158
160
156
X,
152,
180

FIG. 5A 154 206 190a 190 a1 208 202 182a 178 182 104 102 156 152,X 154
148
104
196
178
160
160
158
156

104
196
188
184
186
178
136
174
176
194
160
160
156
158
182
204
172
186
184
190
136d
164
148
166
150
154
Male Valve Axis
152
180
Ref Axis 104
152
X
186
154
136d
168
164
162
166
150
148
190
174
196
188
184
184
182
106
178
186
204
194
176
172
160
160
158
160
156
Male
Valve
Axis
152
180
X 100
102
112
116
136c
108
140
110
126
124
134
136b
132
136a
120
118
164
114
148
166
150
190
136e
196
184
188
106
178
186
182
194
192
204
160
160
160
158
156
X,152,
180

100
116
12,
X,
152,
180
136c
108
124
102
126
110
140
136a
132
136b
134
164
118
114
120
166
104
190
196
106
184
178
186
182
204
194
192
160
158
160
156

100
116
X, 112, 152, 180
126
124
140
102
134
110
108
136b
132
136a
164
120
118
114
148
166
196
190
104
184
186
182
204
192
176
194
160
160
158
156

X, 112, 152, 180
116
102
140
126
108
134
110
132
136a
136b
100
164
120
118
114
104
166
148
196
190
106
184
178
186
182
176
194
192
158
160
160
156

100
116
X, 112, 152, 180
102
140
126
108
110
132
136b
136a
164
120
118
114
166
190
196
184
188
182
106
186
176
178
194
192
104
160
160
160
158
156

BLIND MATE COUPLING WITH A SELF CENTERING MECHANISM

This application is a continuation of U.S. application Ser. No. 18/547,968, filed Aug. 25, 2023, which is a National Stage Application of PCT/IB2022/051643, filed on Feb. 24, 2022, and claims the benefit of and priority to Indian Provisional Patent Application No. 202111008145, filed Feb. 26, 2021, the entire disclosures of which are incorporated by reference in their entireties.

TECHNICAL FIELD

The present disclosure relates generally to coupling assemblies for electronics liquid cooling and more particularly to blind-mate fluid couplings including male and female coupling elements.

BACKGROUND

Coupling assemblies that include male and female coupling members are known in the art. In one common configuration, the individual male and female members of a coupling assembly are connected to provide fluid communication for cooling active components in a data center. For example, a data center may include heat-generating computer system components, such as processors, that are generally supported within a chassis, such as a server rack, to provide efficient storage and accessibility for component installation and removal. In such systems, a coolant such as water or ethylene glycol water may be provided from a coolant source and flow through a supply conduit to one or more heat exchangers disposed in the data center. The warmed coolant from the heat exchanger can be returned to the coolant source to be cooled by a cooler or refrigeration system and circulated back through the supply conduit. This fluid circuit may include fluid couplings, such as mating male and female couplings, that deliver the fluid in the system to remove the heat produced by active components within the computer system.

In some systems, the male and female couplings are positioned in a location that is difficult to access such as at the back of a computer chassis or rack. As such, misalignments between the male and female couplings may occur and it may require substantial amount of effort and time to connect a pair of male and female couplings to create a fluid circuit.

SUMMARY

Heat generated within computing hardware results from electrical current flowing through active components of the computing system. To cool the computing system, fluid systems have been designed with fluid couplings according to the present disclosure. The present disclosure relates generally to fluid couplings that provide a fluid circuit. The couplings can include a supply and a return coupling that are mated together to create the fluid circuit. First and second female couplings can be secured in a fixed configuration at the back of a computer chassis or rack on opposing sides thereof and are oriented in a forward direction into the rack. First and second male couplings can be secured in a fixed configuration on a rearward end of a computer apparatus on opposing sides thereof. The computer apparatus is adapted to be inserted into a bay of the chassis for mating the first and second male couplings with the first and second female couplings.

The male coupling can be arranged and configured with an alignment compensator to provide nominal alignment. When the computer apparatus is inserted into the bay of the chassis, the male coupling may be offset from the female coupling resulting in misalignment which can be corrected by the alignment compensator. The alignment compensator allows the male coupling to move in a lateral direction, a vertical direction, and at an angle relative to a longitudinal axis defined by the male coupling in order to correct any misalignment during mating.

Another aspect of the present disclosure relates to a fluid coupler that includes a valve body defining a valve body axis, a valve arrangement for opening and closing fluid flow through the valve body, and a valve mounting housing in which the valve body is mounted via an alignment compensation arrangement. The valve mounting housing defines a central mounting housing axis. The alignment compensation arrangement can include a compensation sleeve, a compensation ring, and a compensation spring mounted within the valve mounting housing. The compensation spring can be configured to bias the compensation sleeve and the compensation ring axially apart from one another. The valve body can extend through the compensation sleeve and compensation ring such that the compensation sleeve and the compensation ring are positioned radially between the valve mounting housing and the valve body. The alignment compensation arrangement can be movable within the valve mounting housing between an extended state and a compressed state. The compensation ring can be spaced axially further from the compensation sleeve when the alignment compensation arrangement is in in the extended state as compared to the contracted state. The compensation spring biases the alignment compensation arrangement toward the extended state. A tapered interface can be defined between the valve body and at least one of the compensation sleeve and the compensation ring. The tapered interface automatically positions valve body in a centered position in which the valve body axis and the central mounting housing are co-axially aligned when the alignment compensation arrangement moves to the extended state. The tapered interface causes the compensation sleeve and the compensation ring to be moved axially toward one another when a tilt load or radial translation load is applied to the valve body thereby allowing the valve body to be angularly displaced or radially translated relative to a centered position.

In some examples, the compensation sleeve, the compensation ring and the compensation spring are co-axially aligned with respect to the central mounting housing axis and are positioned radially between the valve body and a cylindrical inner surface of the valve mounting housing.

In some examples, the valve body includes an outer annular compensation recess defined between a first contact surface and a second contact surface, and wherein the compensation sleeve and the compensation ring are captured between the first and second contact surfaces of the valve body.

In some examples, the tapered interface includes a first tapered surface defined by the compensation ring that engages the first contact surface of the valve body and a second tapered surface defined by the compensation sleeve that engages the second contact surface of the valve body.

In some examples, the compensation sleeve and the compensation ring are accommodated in the outer annular compensation recess of the valve body to allow pivotal and radial translational movement of the valve body relative to the valve mounting housing.

In some examples, axial movement of the valve body relative to the valve mounting housing is accommodated by movement of the compensation ring and the compensation sleeve between the expanded and compressed states.

In some examples, the tapered interface includes nested tapers.

In some examples, the tapered interface includes nested conical tapers.

In some examples, the alignment compensation arrangement allows the valve body to be angled universally relative to the valve mounting housing and to be radially translated universally relative to the valve mounting housing.

In some examples, the compensation sleeve includes an outer annular flange that contact an inner cylindrical surface of the valve mounting housing, wherein the annular flange allows the compensation sleeve to pivot at least 5 degrees relative to the valve mounting housing universally about the central mounting housing axis.

A fluid coupler can include a valve body defining a valve body axis, a valve arrangement for opening and closing fluid flow through the valve body, and a valve mounting housing in which the valve body is mounted via an alignment compensation arrangement movable within the valve mounting housing, the valve mounting housing defining a central mounting housing axis. The alignment compensation arrangement biases the valve body into an aligned position in which the valve body axis is coaxially aligned with the central mounting housing axis and enables the valve body to be axially displaced, angularly displaced, and radially translated relative to the valve mounting housing.

In some examples, the alignment compensation arrangement includes a compensation sleeve, a compensation ring, and a compensation spring mounted within the valve mounting housing, the compensation spring being configured to bias act on one or both of the compensation sleeve and the compensation ring.

In some examples, the alignment compensation arrangement is movable within the valve mounting housing between an extended state and a compressed state, the compensation ring being spaced axially further from the compensation sleeve when the alignment compensation arrangement is in in the extended state as compared to the contracted state, the compensation spring biasing the alignment compensation arrangement toward the extended state.

In some examples, the compensation arrangement includes a tapered interface being defined between the valve body and at least one of the compensation sleeve and the compensation ring.

In some examples, the tapered interface automatically positions the valve body in the first position when the alignment compensation arrangement moves to the extended state, and wherein the tapered interface causes the compensation sleeve and the compensation ring to be moved axially toward one another when a tilt load or radial translation load is applied to the valve body thereby allowing the valve body to be angularly displaced or radially translated relative to the first position.

In some examples, the valve body can be axially displaced relative to the valve mounting housing by a first float distance between an extended position and a contracted position, and wherein the valve body can be axially displaced and radially translated relative to the valve mounting housing in both the extended and contracted positions.

In some examples, the valve body can be translated in any radial direction from the central housing mounting axis and/or wherein the valve body can be displaced in any angular direction from the central housing mounting axis.

In some examples, the valve body can be angularly displaced relative to the valve mounting housing by an angle of 5 degrees between the valve body axis and the central mounting housing axis.

In some examples, the valve body can be radially translated relative to the valve mounting housing by a lateral offset distance of 5.25 millimeters.

In some examples, the valve body can be axially displaced relative to the valve mounting housing by a float distance of 4.5 millimeters.

These and other features and advantages will be apparent from a reading of the following detailed description and a review of the associated drawings. It is to be understood that both the foregoing general description and the following detailed description are exemplary and explanatory only and are not restrictive of the broad concepts upon which the embodiments disclosed herein are based.

BRIEF DESCRIPTION OF THE DRAWINGS

The accompanying drawings, which are incorporated in and constitute a part of the description, illustrate several aspects of the present disclosure. A brief description of the drawings is as follows:

Figure 5A:
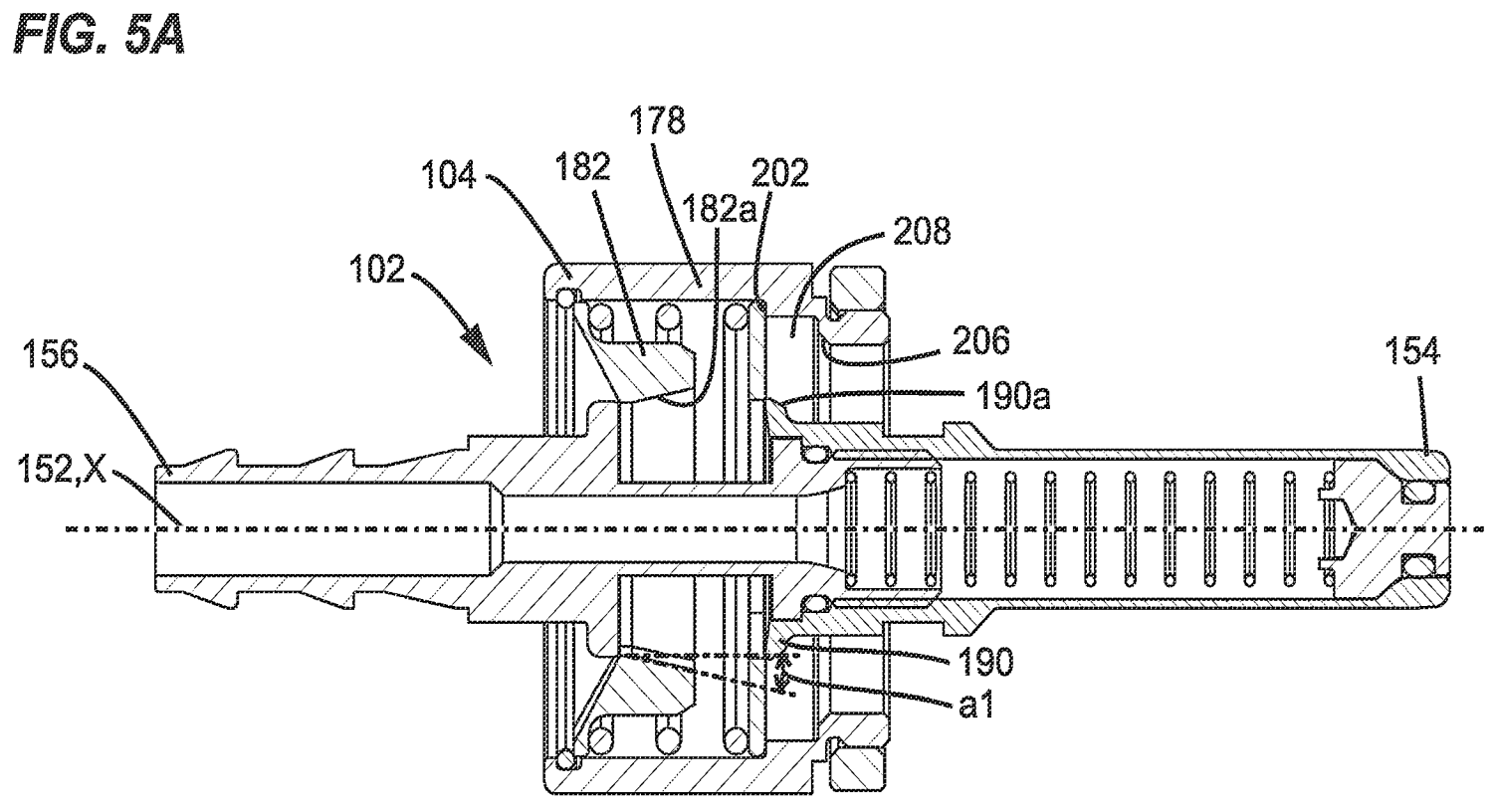

FIG. 5A illustrates an enlarged view of a portion of the male fluid coupler of FIG. 4 showing additional features not present in the example shown at FIG. 5;

DETAILED DESCRIPTION

Figure 1:
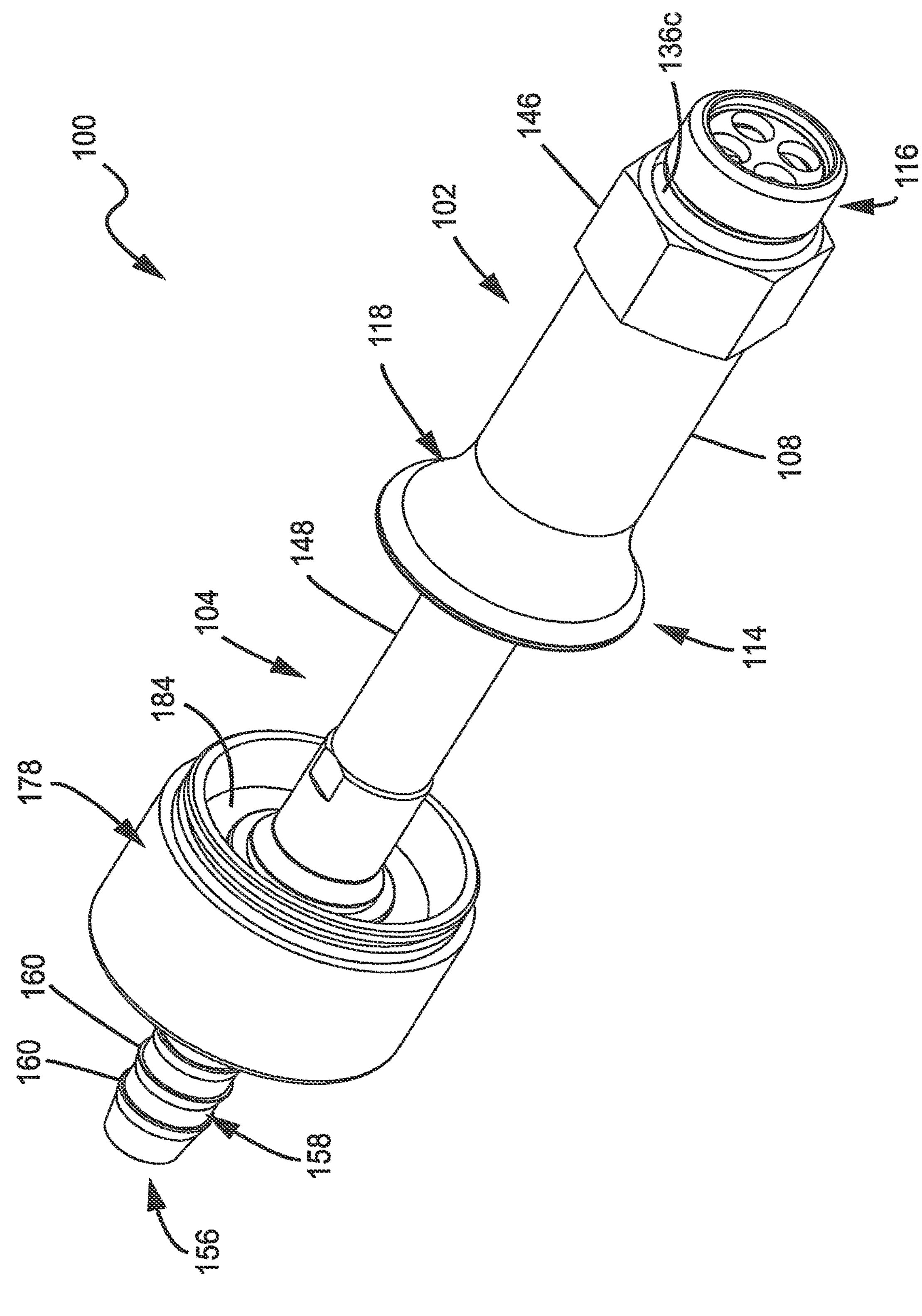
FIG. 1 illustrates a perspective view of a blind mate coupling assembly depicting a male fluid coupler and a female fluid coupler uncoupled in accordance with principles of the present disclosure.

Reference will now be made in detail to the exemplary aspects of the present disclosure that are illustrated in the accompanying drawings. Wherever possible, the same reference numbers will be used throughout the drawings to refer to the same or like structure.

An example blind-mate fluid coupling system is adapted for use in applications in which space or clearance limitations prevent the coupling system from being manually aligned with visual assistance during coupling. An example blind-mate coupling system includes mating male and female valve components. In certain examples, the male and female valve components can mount to first and second structural components that are movable relative to one another. For example, female valve components can be mounted at the back of a rack for supporting slidable drawers, and male valve components can be mounted at the back sides of the drawers such that when the drawers are slid into the rack the male valve components mate with the female valve components.

In one example, the drawers can carry active equipment such as data computing/processing equipment that generates heat, and the blind-mate fluid coupling system can connect the drawers to a source of cooling fluid such that cooling fluid can be circulated through heat exchangers on the drawers for cooling the active equipment. To ensure proper mating of the blind-mate fluid couplings, the male and female valve components either need to be very precisely mounted on their respective structural components so that no misalignment exists between the male and female valve components, or the blind-mate fluid couplings can be configured with a compensation arrangement for compensating for misalignment between the male and female valve components.

Aspects of the present disclosure relate to misalignment compensation arrangements for compensating for misalignment between male and female valve components of a blind-mate fluid coupling. In one example, the female valve component includes a guide feature (e.g., a tapered feature such as a funnel) for guiding the male valve component into alignment with the female valve feature, and the male valve component includes a compensation arrangement for allowing the male valve component to move relative to the structural component to which it is mounted to adjust for misalignment between the male valve component and the female valve component.

In one example, the male component is spring biased toward a neutral position but is able to move from the neutral position to adjust for misalignment with the female valve component. The movement can include angular pivoting to adjust for angular mismatches and translational movement to account for radial misalignment. The goal is to bring the male component into coaxial alignment with the female component during the insertion/coupling process by allowing the male valve component to move (e.g., float) from the neutral position to an aligned position as the male valve component is guided into the female valve component while the components are axially inserted together.

In one example, the male valve component can be angled at least a predetermined amount universally (i.e., in all 360 degrees) with respect to a reference axis and the male valve component can be radially translated at least a predetermined amount universally with respect to the reference axis. In one example, the male valve component self-centers on the reference axis via nesting tapers that are spring biased together. In one example, compression of the spring during the mating process provide clearance between the nesting tapers that allows for the male valve component to move respect to the reference axis (e.g., tilt or translate) to an aligned position.

Most rack-mounted communications and information technology equipment consumes electrical power and generates heat. Heat produced by rack-mounted equipment can have adverse effects on the performance, reliability and useful life of the equipment components. In particular, rack-mounted equipment housed within an enclosure can be vulnerable to heat build-up and hot spots produced during operation. Equipment rooms and data centers are typically equipped with an air conditioning or cooling system that supplies and circulates cool air or liquid to rack-mounted equipment and enclosures.

Figure 2:
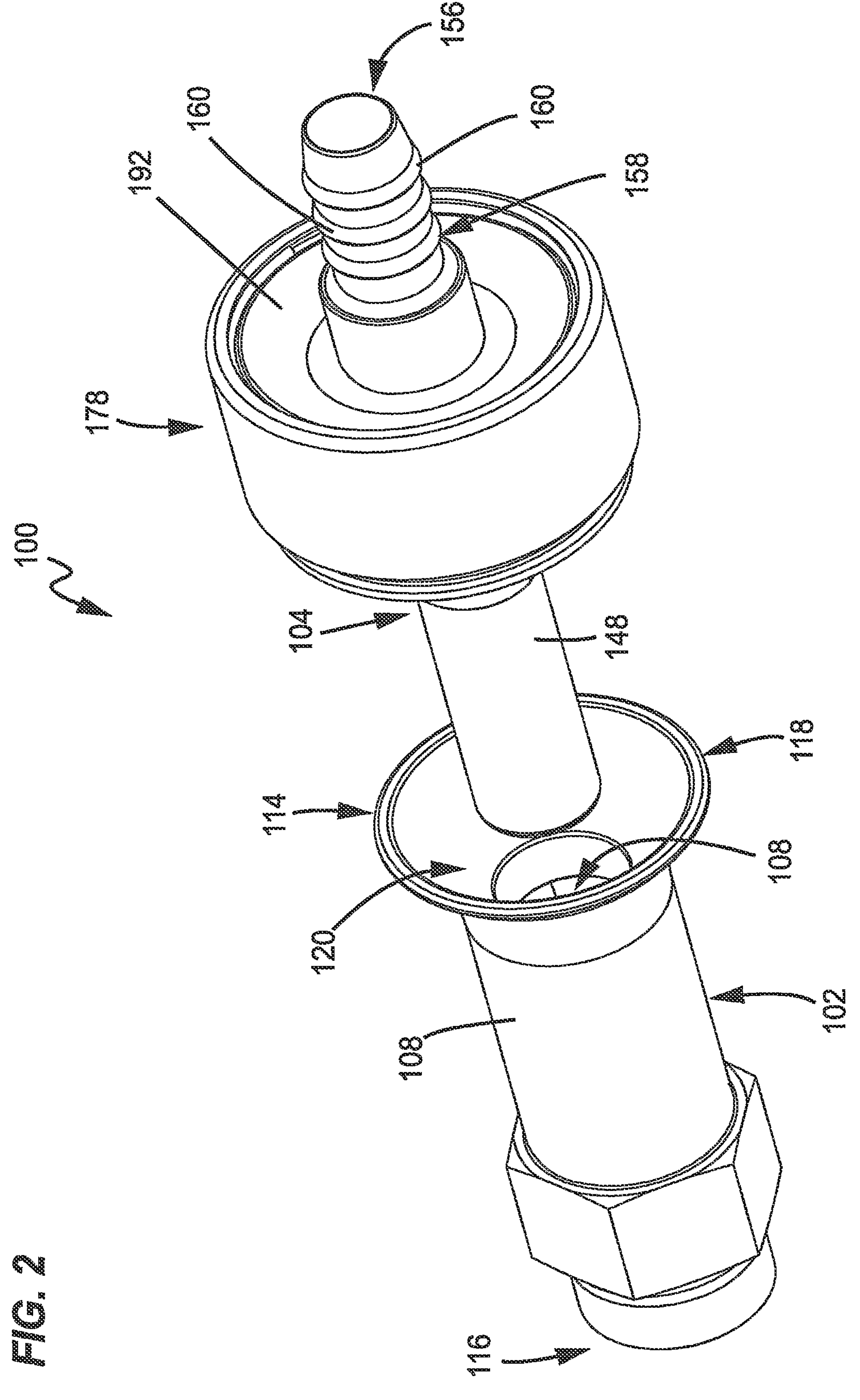
FIG. 2 illustrates another perspective view of the blind mate coupling assembly of FIG. 1.
Figure 3:
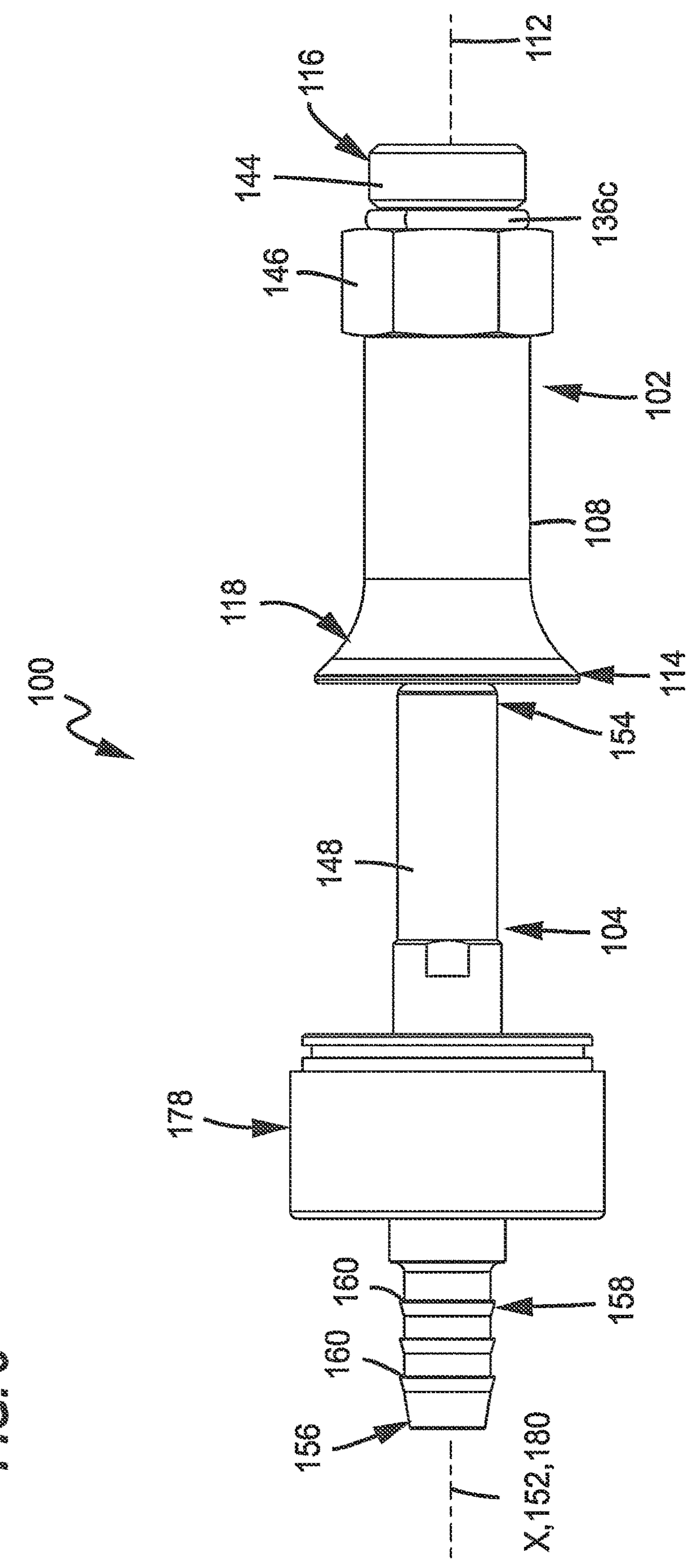
FIG. 3 illustrates a side view of the blind mate coupling assembly of FIG. 1.

FIGS. 1-3 illustrate an example coupling assembly 100 for use in a fluid line configured to cool electronic components contained within information technology equipment located in a data center. The coupling assembly 100 can include a first fluid coupler 102 and a second fluid coupler 104 that mate together in order to provide fluid communication therebetween.

Typically, a cooling circuit may include a fluid cooled heat exchanger in thermal contact with a heat-generating device, such as the information technology equipment. The information technology equipment can be received within a bay of a chassis or rack in the data center. In certain examples, the first fluid coupler 102 may be secured in a fixed position at the rear of a chassis bay or computer rack and oriented in a forward direction into the bay and the second fluid coupler 104 can be secured to a rearward end of the information technology equipment and oriented in a rearward direction. When the information technology equipment is mounted inside a computer rack or bay chassis, the mating of the first fluid coupler 102 with the second fluid coupler 104 to provide fluid communication therebetween may be performed in a "blind mate" fashion, where an operator cannot see the first fluid coupler 102 when the information technology equipment is installed in the computer rack. It will be appreciated that the first and second fluid couplers 102, 104 may be equally operable if their positions were reversed.

The first and second fluid couplers 102, 104 are typically dissimilar but complementary, such as one male coupler and one female coupler. In certain examples, a substantial amount of effort and time may be required to mate the first and second couplers 102, 104 together because the couplers are disposed in a location that may be difficult to access or align, i.e., the back of the technology equipment and bay chassis. Accordingly, the second fluid coupler 104 of the coupling assembly 100 includes an alignment compensation arrangement 106 (see FIG. 4) that can adjust for any initial misalignment between the first and second fluid couplers 102, 104. The alignment compensation arrangement 106 functions as a universal connection joint that allows the second fluid coupler 104 to universally pivot and move radially.

The alignment compensation arrangement 106 permits the second fluid coupler 104 to move in various directions, such as, in a lateral direction, a vertical direction, and at an angle relative to a longitudinal axis X (e.g., a reference axis) defined by the alignment compensation arrangement 106. The second fluid coupler 104 can adjust in angle and position as the second fluid coupler 104 is inserted into the first fluid coupler 102 to be coaxially aligned therewith. The alignment compensation arrangement 106 in the coupling assembly 100 is advantageous because it provides for increased reliability in the mating performance of blind couplers.

Figure 15:
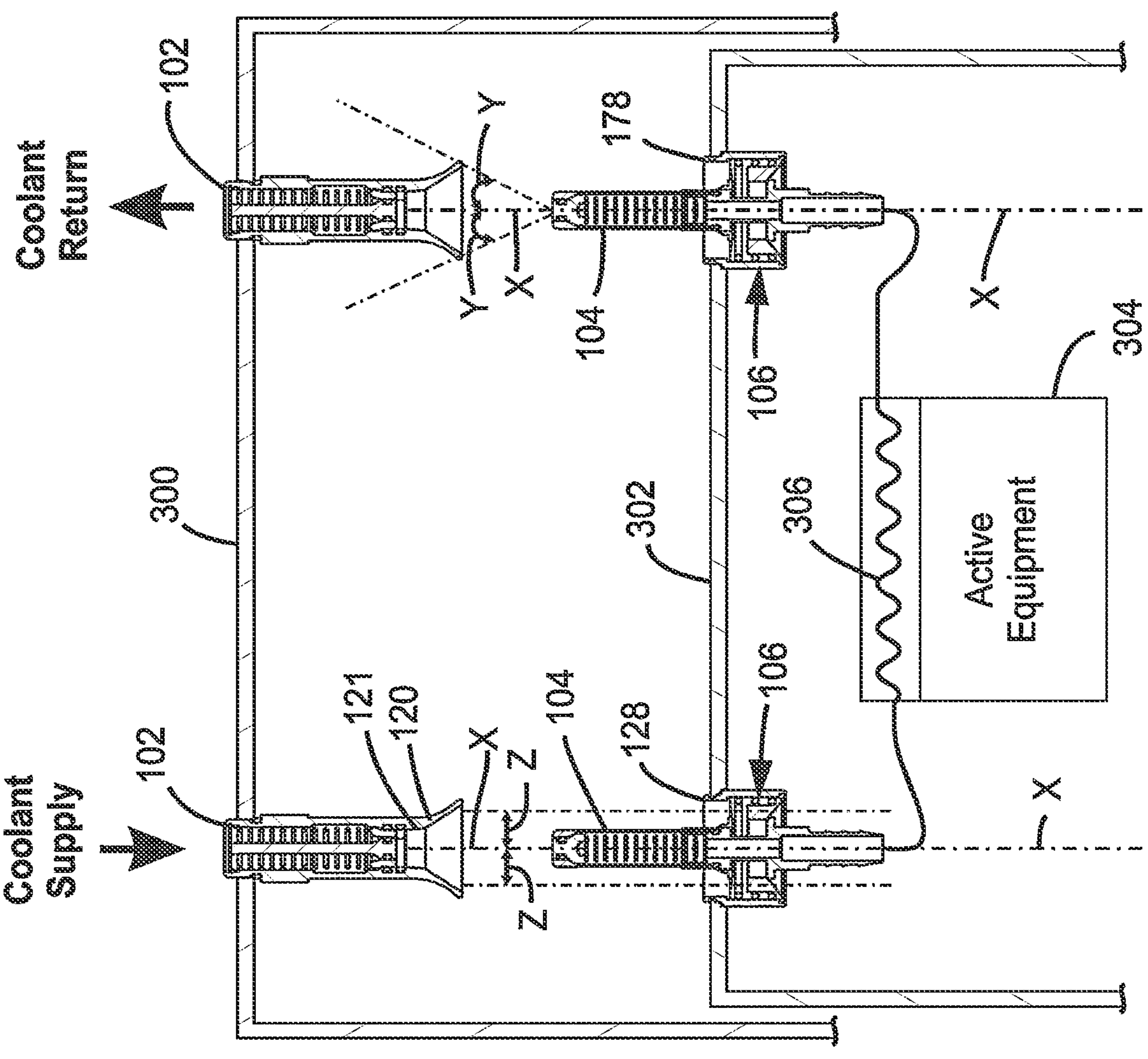
FIG. 15 illustrates a top environmental view of a portion of a data processing bay including the coupling assembly on a rack and a drawer in accordance with the principles of the present disclosure.

FIG. 15 depicts a portion of a data processing bay including a rack 300 to which a drawer 302 (e.g., a panel) slidably mounts. Active equipment 304 such as data processing or computing equipment is supported on the drawer 302. A heat exchanger 306 is provided at the drawer 302 for cooling the active equipment 304. First fluid couplers 102 (e.g., female couplers) are fixed to the rack 300 adjacent a back of the rack 300. One of the first fluid couplers 102 is fluidly connected to a coolant supply and the other is fluidly connected to a coolant return. Second fluid couplers 104 are coupled to a back side of the drawer 302 in general alignment with the first fluid couplers 102. The second fluid couplers 104 are fluidly connected to the heat exchanger 306 such that when the couplers are coupled together, coolant is circulated through the heat exchanger 306. The second fluid couplers 104 are connected to the drawer 302 by valve mounting housings 178 which when secured to the drawer 302 establish the position and angle of the reference axis X. When unmated as shown at FIG. 15, the second fluid couplers 104 are spring biased to neutral positions in which the second couplers are co-axially aligned with their respective reference axes X. However, during mating with the first fluid couplers 102, the alignment compensation arrangement 106 allows the second fluid couplers 104 to translate a distance Z universally with respect to their respective reference axes X and also allows the second fluid couplers 104 to tilt an angle Y universally with respect to their respective reference axes X. The first and second fluid couplers 102, 104 automatically couple together as the drawer 302 is moved to a closed position, and the drawer can be latched in the closed position to maintain the first and second fluid couplers 102, 104 coupled together. As the drawer 302 is closed, the second fluid couplers 104 contact guide structures (e.g., funnels or other alignment surfaces) of the first fluid couplers 102 causing the second fluid couplers 104 to translate and/or tilt as needed with respect to their respective reference axes X to move the second fluid couplers into co-axial alignment with respect to their respective first fluid couplers 102. Thus, the moveability of the second fluid couplers 104 relative to the valve mounting housings 178 and the drawer 302 allows the second fluid couplers 104 to adjust in position during the coupling process as needed to compensate for misalignment between the first and second fluid couplers 102, 104.

Figure 4:
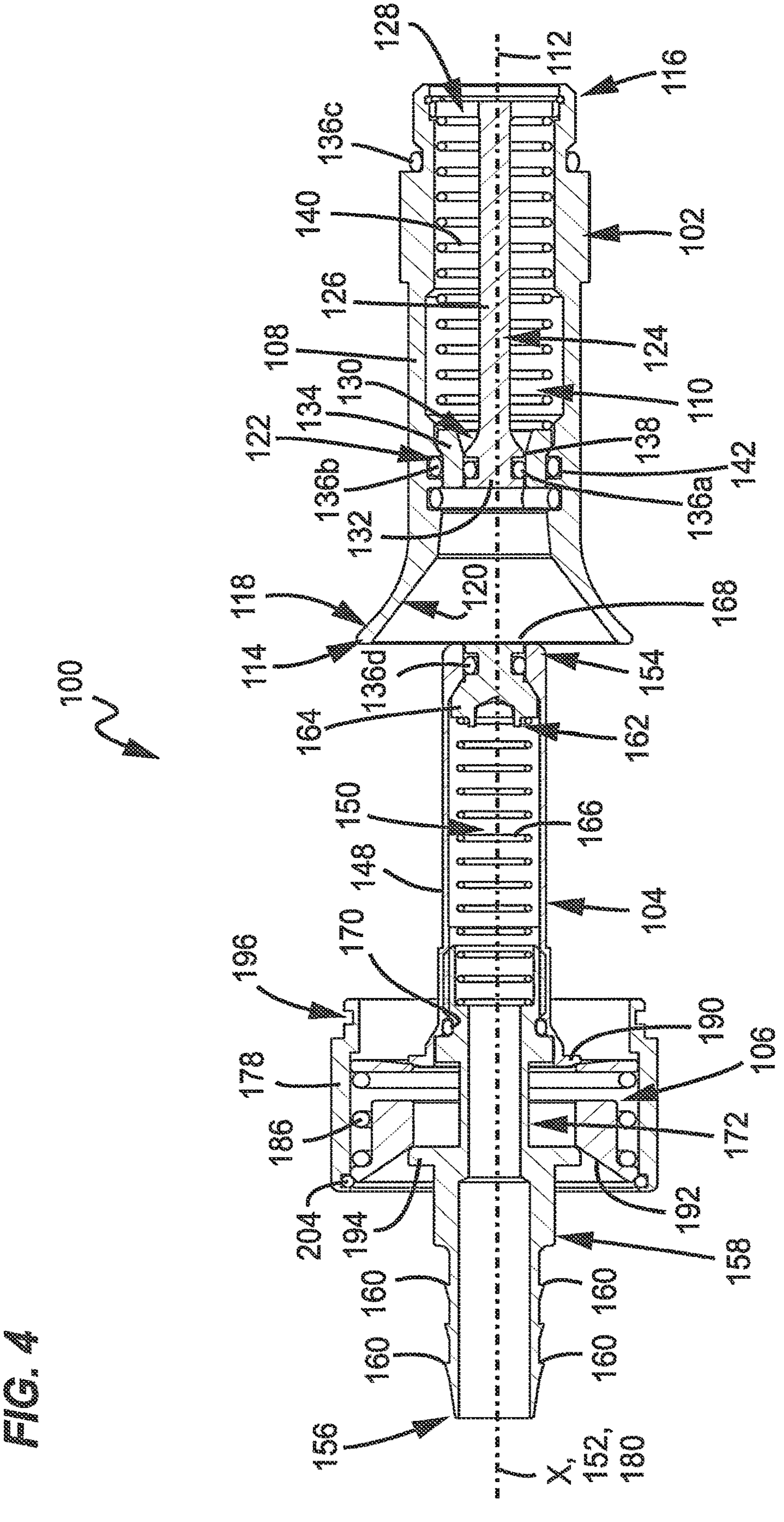
FIG. 4 illustrates a cross-sectional view of the blind mate coupling assembly of FIG. 3.

FIG. 4 illustrates a cross-sectional view of the coupling assembly 100 in its disconnected or uncoupled position. While in this position, fluid is not transmitted through the first and second fluid couplers 102, 104. The first fluid coupler 102 is a female coupling member. The first fluid coupler 102 includes a female valve body 108 that has a female valve body channel 110. The female valve body channel 110 defines a central female valve body axis 112. The female valve body channel 110 can extend longitudinally along the central female valve body axis 112 from a first end 114 of the female valve body 108 to a second end 116 of the female valve body 108. In certain examples, the first end 114 of the female valve body 108 may be formed with a collar 118 that defines an alignment funnel 120 for guiding the second fluid coupler 104 toward alignment with the central female valve body axis 112 when the first and second fluid couplers 102, 104 are mated together.

The first fluid coupler 102 also includes a first valve arrangement 122 for opening and closing fluid flow through the female valve body channel 110. The first valve arrangement 122 includes a valve stem 124 aligned along the central female valve body axis 112. The valve stem 124 can be axially fixed with respect to the female valve body 108. The valve stem 124 includes a stem body 126 that has a base end 128 fixed with respect to the female valve body 108 and positioned adjacent to the second end 116 of the female valve body 108. The stem body 126 can also include a free end 130 that has a fixed valve head 132. The first valve arrangement 122 can further include a valve sleeve 134 positioned within the female valve body channel 110.

Figure 14:
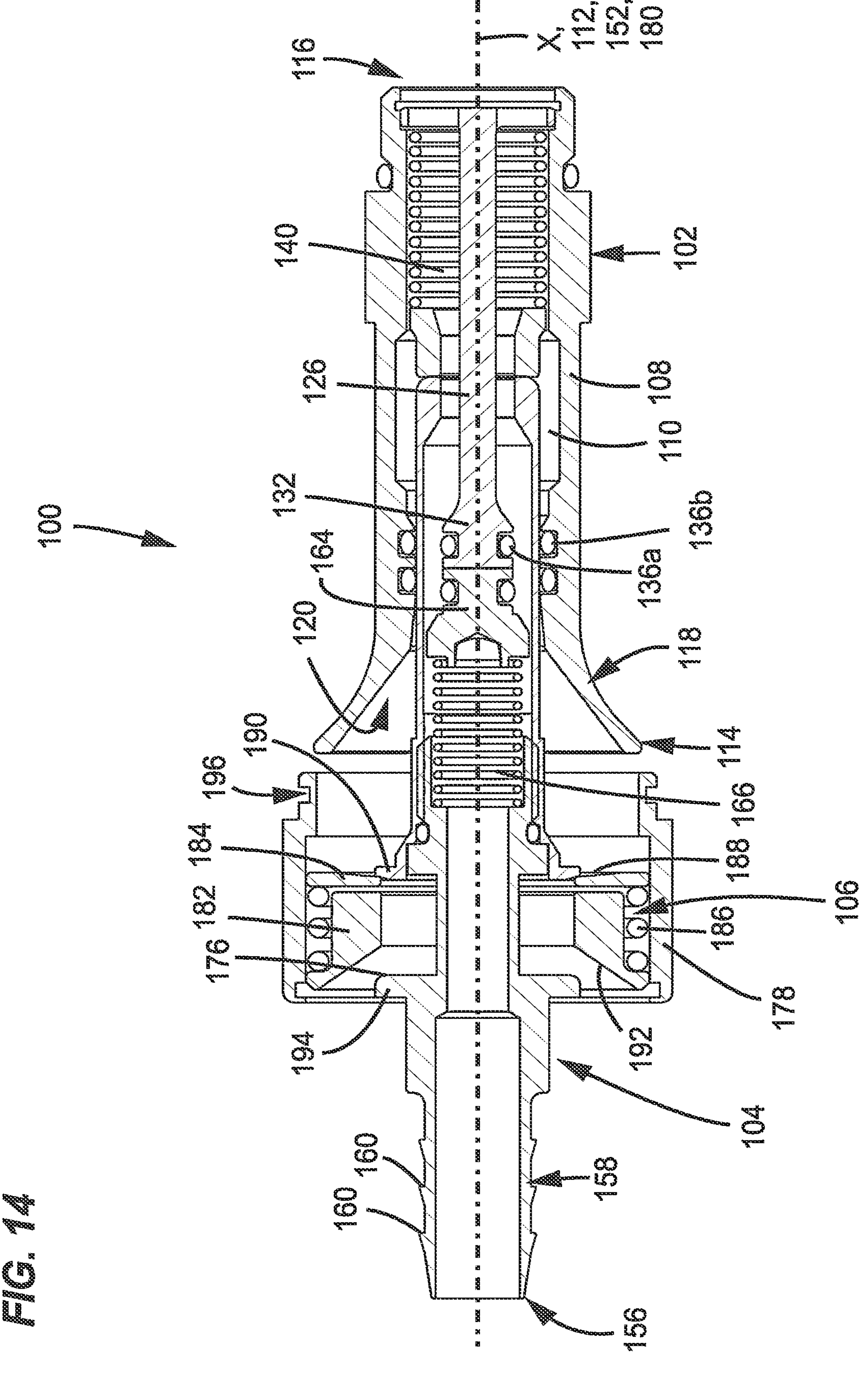

The valve sleeve 134 can be axially movable in the female valve body channel 110 relative to the fixed valve head 132 and the female valve body 108 between a closed position and an open position (see FIG. 14). When in the closed position, the valve sleeve 134 cooperates with the fixed valve head 132 to prevent fluid flow through the female valve body channel 110. Seal ring **136*a* (e.g., first radial seal) can be positioned within grooves 138 defined in the fixed valve head 132 to ensure a liquid seal when the valve sleeve 134 is in the closed position. That is, the seal ring 136*a* can make an inner seal with the valve sleeve 134 when the valve sleeve 134 is in the close position. When in the open position, fluid flow is permitted though the female valve body channel 110 as the valve sleeve 134 is moved axially away from the fixed valve head 132 and towards the second end 116 of the female valve body 108 or base end 128 of the valve stem 124**.

The first valve arrangement 122 can further include a first valve spring 140 positioned about the stem body 126 for biasing the valve sleeve 134 toward the first end 114 of the female valve body 108 and toward the closed position.

The female valve body channel 110 defines an annular recess 142 for mounting a seal ring **136*b* (e.g., a second radial seal) that can be positioned adjacent to an exterior of the valve sleeve 134. The seal ring 136*b* can be in engagement with the female valve body 108 to prevent fluid flow between the components. The seal ring 136*b* can make an outer seal with the valve sleeve 134 when the valve sleeve 134 is in the closed position. During connection of the first and second fluid couplers 102, 104**, if a misalignment occurs leakage does not result, thereby providing a no spill unit.

The first fluid coupler 102 is also provided with exterior threads 144 (see FIG. 3) and a seal ring **136*c* (e.g., a third radial seal) adjacent the threads 144. The exterior threads 144 and a torque transfer interface 146 (e.g., wrench flats, see FIG. 3) are utilized to threadably secure the first fluid coupler 102 to an internally threaded fitting within a bay chassis. That is, the first fluid coupler 102** can be secured in a fixed position at the back of a bay chassis and oriented in a forward direction into the bay.

Still referring to FIG. 4, the second fluid coupler 104 is a male coupling member. The second fluid coupler 104 includes a male valve body 148 that has a male valve body channel 150. The male valve body channel 150 defines a central male valve body axis 152. The male valve body channel 150 extends longitudinally along the central male valve body axis 152 from a valved end 154 of the male valve body 148 to a hose connection end 156 of the male valve body 148. In one example, the hose connection end 156 includes a nipple 158 with barbs 160. A fluid line may be sized to fit or press over the nipple 158. The fluid line may be fabricated from elastic material (e.g., a rubber hose, plastic tubing) such that when mounted over the nipple 158, the barbs 160 can press into the fluid line to hold it.

The second fluid coupler 104 also includes a second valve arrangement 162 for opening and closing fluid flow through the male valve body channel 150. The second valve arrangement 162 can include a valve member 164 within the male valve body channel 150 that is axially movable relative to the male valve body 148 between a closed position and an open position (see FIG. 14). The valve member 164 can be a plug valve. When in the closed position, the valve member 164 prevents fluid flow through the male valve body channel 150. The valve member 164 can be spring biased toward the valved end 154 of the male valve body 148 and the closed position by a second valve spring 166. When in the open position, fluid flow is permitted though the male valve body channel 150 as the valve member 164 is moved to the left against the force of the second valve spring 166.

A seal ring **136*d* (e.g., a fourth radial seal) may be positioned within a recess 168 defined in the valve member 164. The seal ring 136*d* ensures a liquid seal when the valve member 164 is closed, as shown in FIG. 4. The seal ring 136*d* seals against a sealing surface of the male valve body 148 adjacent the valved end 154 of the male valve body 148 when the valve member 164 is in the closed position. Another seal ring 136*e* (e.g., fifth radial seal) can also be provided in a groove 170 within the male valve body channel 150 to prevent fluid flow between the components. If misalignment occurs during mating with the first fluid coupler 102**, leakage does not result, thereby providing a no spill unit.

Figure 5:
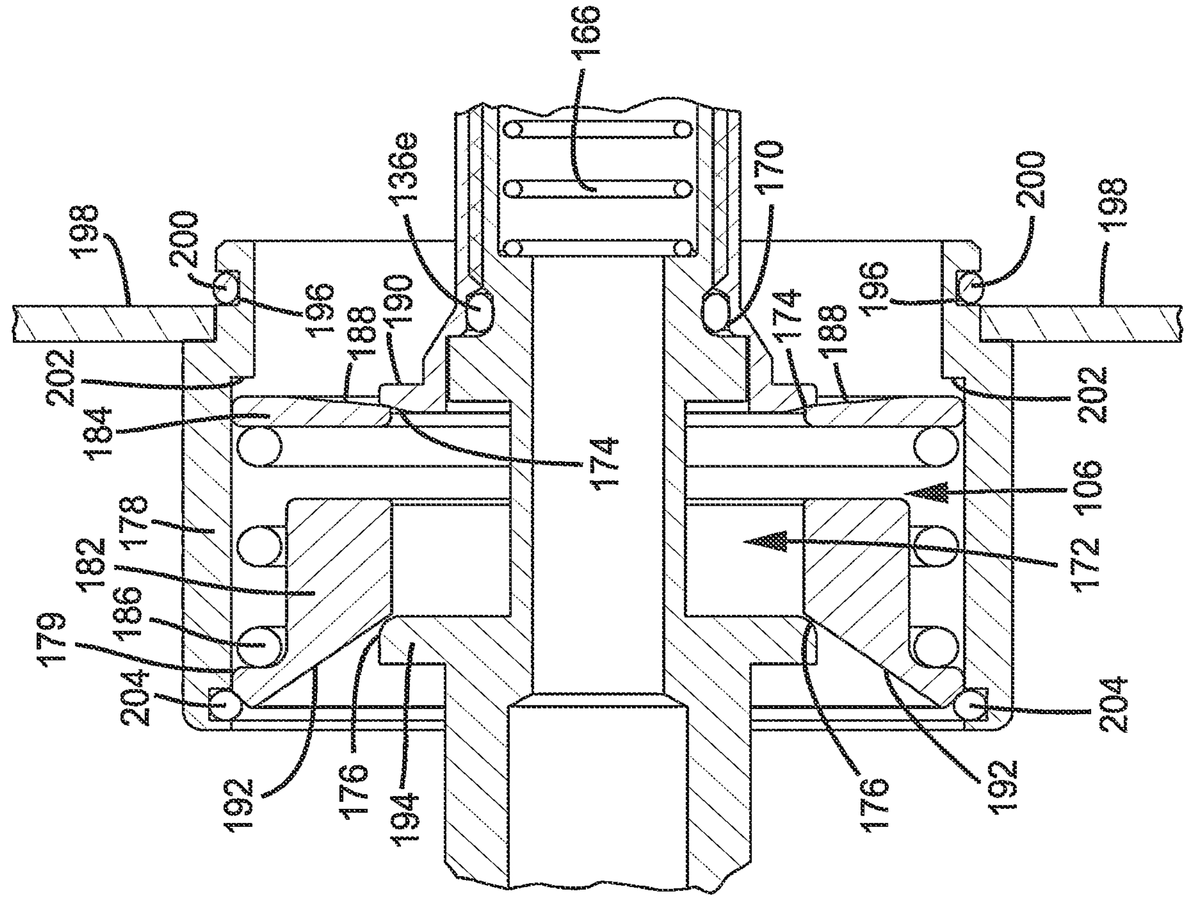
FIG. 5 illustrates an enlarged view of a portion of the male fluid coupler of FIG. 4.

Referring to FIG. 5, the male valve body 148 includes an outer annular compensation recess 172 defined between a first contact surface 174 and a second contact surface 176. The first contact surface 174 can be closer to the valved end 154 of the male valve body 148 and the second contact surface 176 can be closer to the hose connection end 156 of the male valve body 148.

The second fluid coupler 104 also includes a valve mounting housing 178 in which the male valve body 148 is mounted via the alignment compensation arrangement 106. The valve mounting housing 178 defines a central mounting housing axis 180 which corresponds to the longitudinal axis X. The alignment compensation arrangement 106 includes a compensation sleeve 182, a compensation ring 184 and a compensation spring 186 that biases the compensation sleeve 182 and the compensation ring 184 axially apart from one another. The compensation sleeve 182, the compensation ring 184 and the compensation spring 186 can be co-axially aligned with respect to the central mounting housing axis 180 and can be positioned radially between the male valve body 148 and the valve mounting housing 178. The compensation sleeve 182 and the compensation ring 184 can be captured between the first and second contact surfaces 174, 176 of the male valve body 148.

Figure 10:
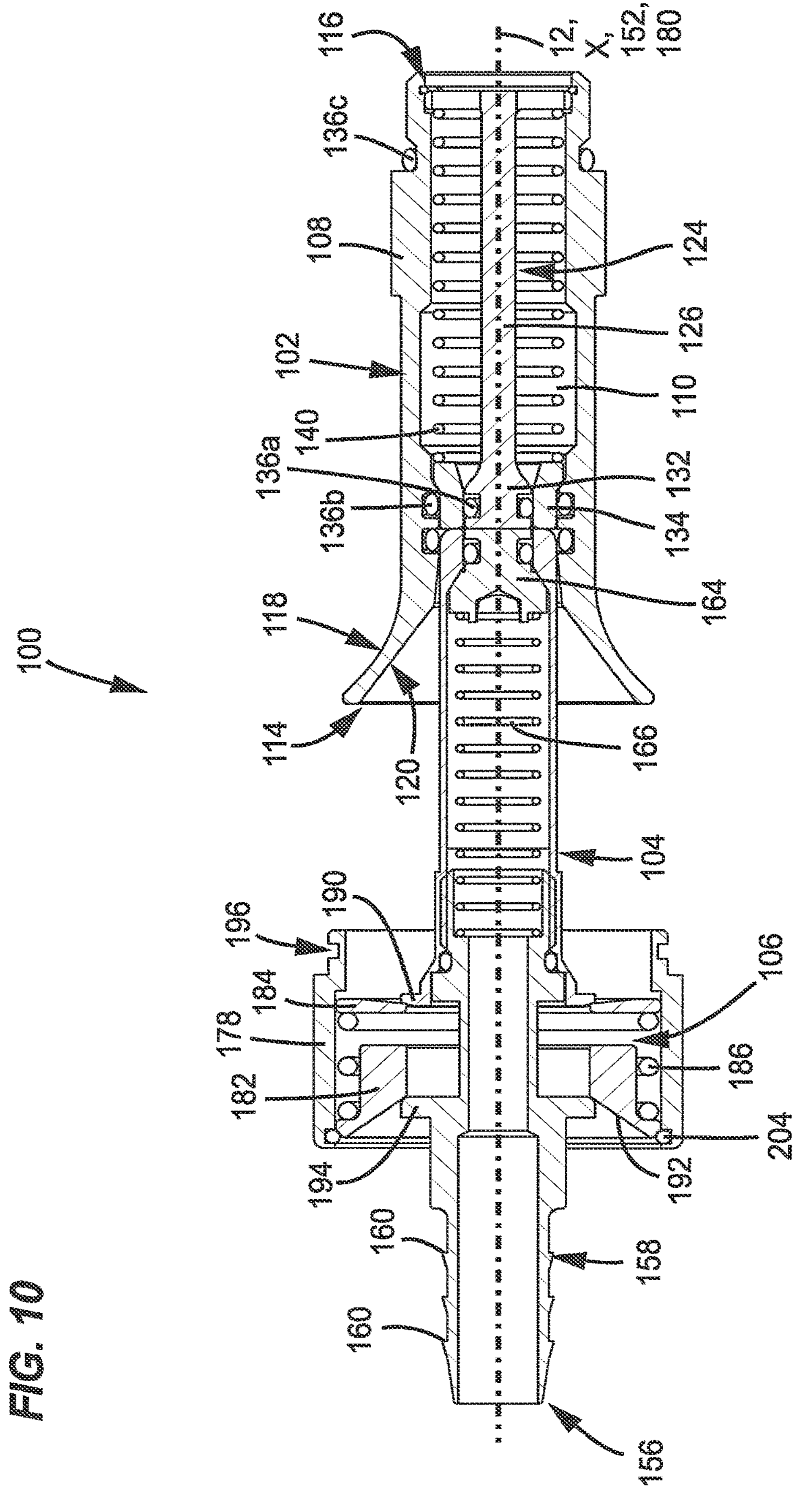
Figure 11:
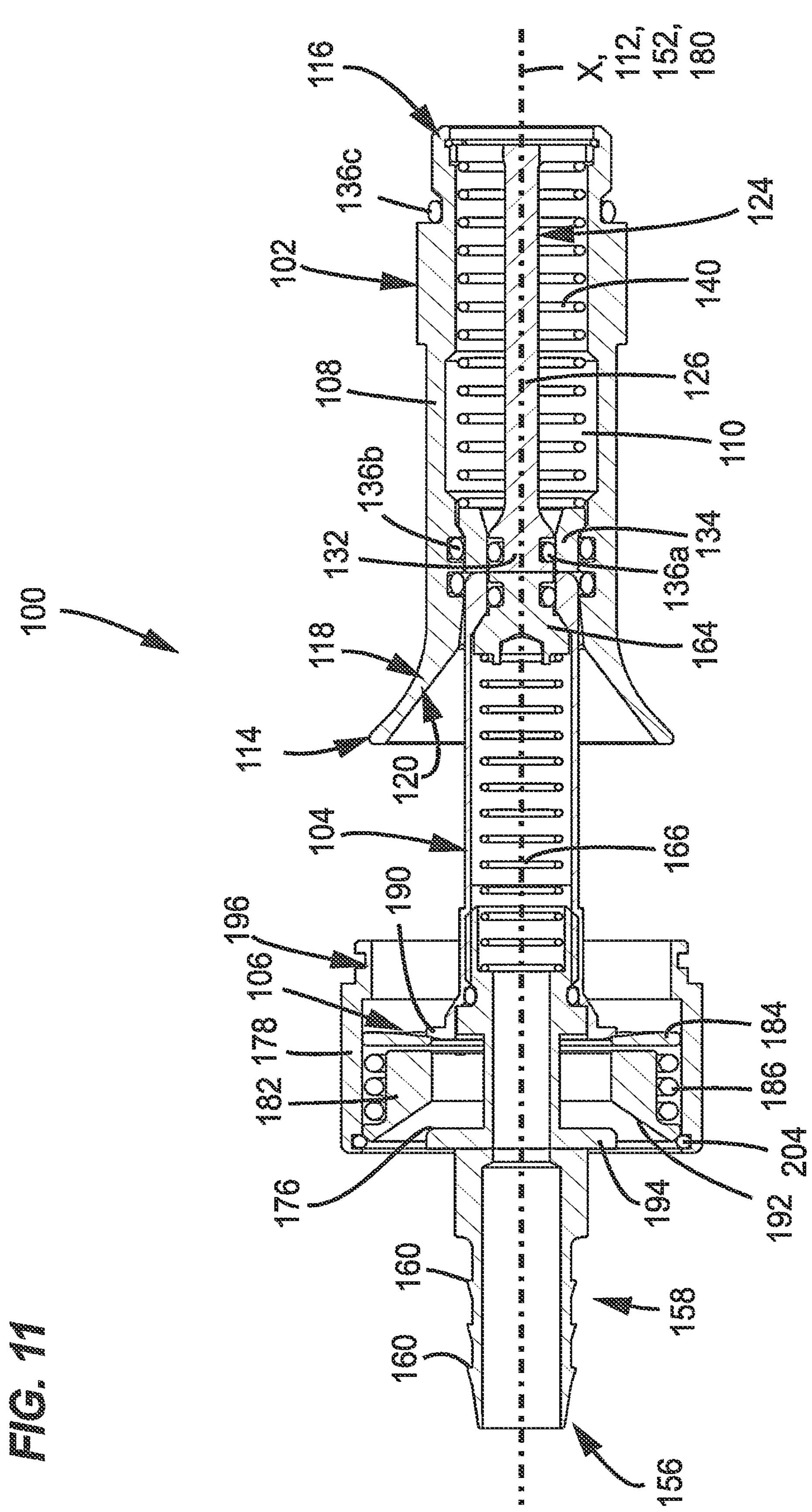
Figure 12:
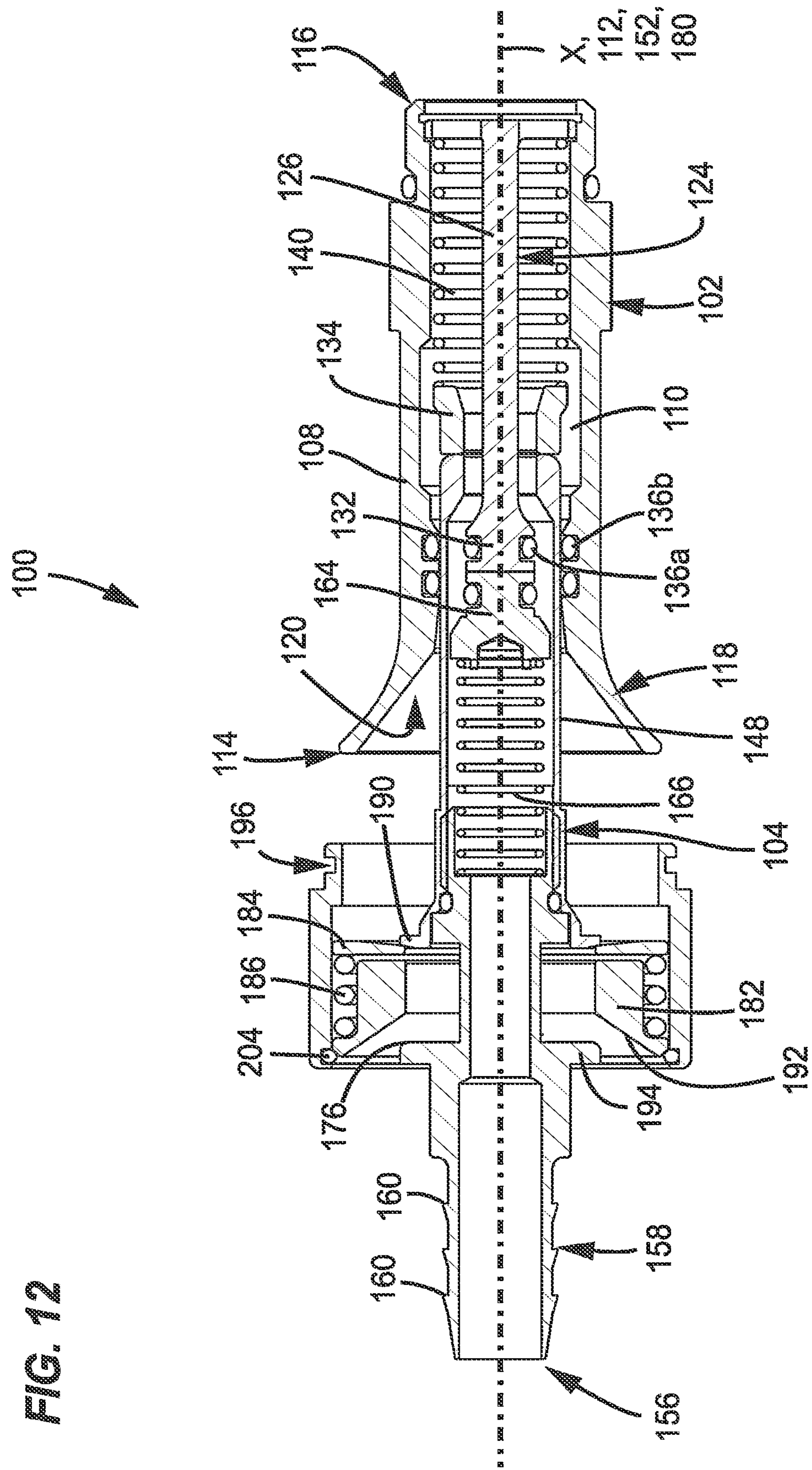
Figure 13:
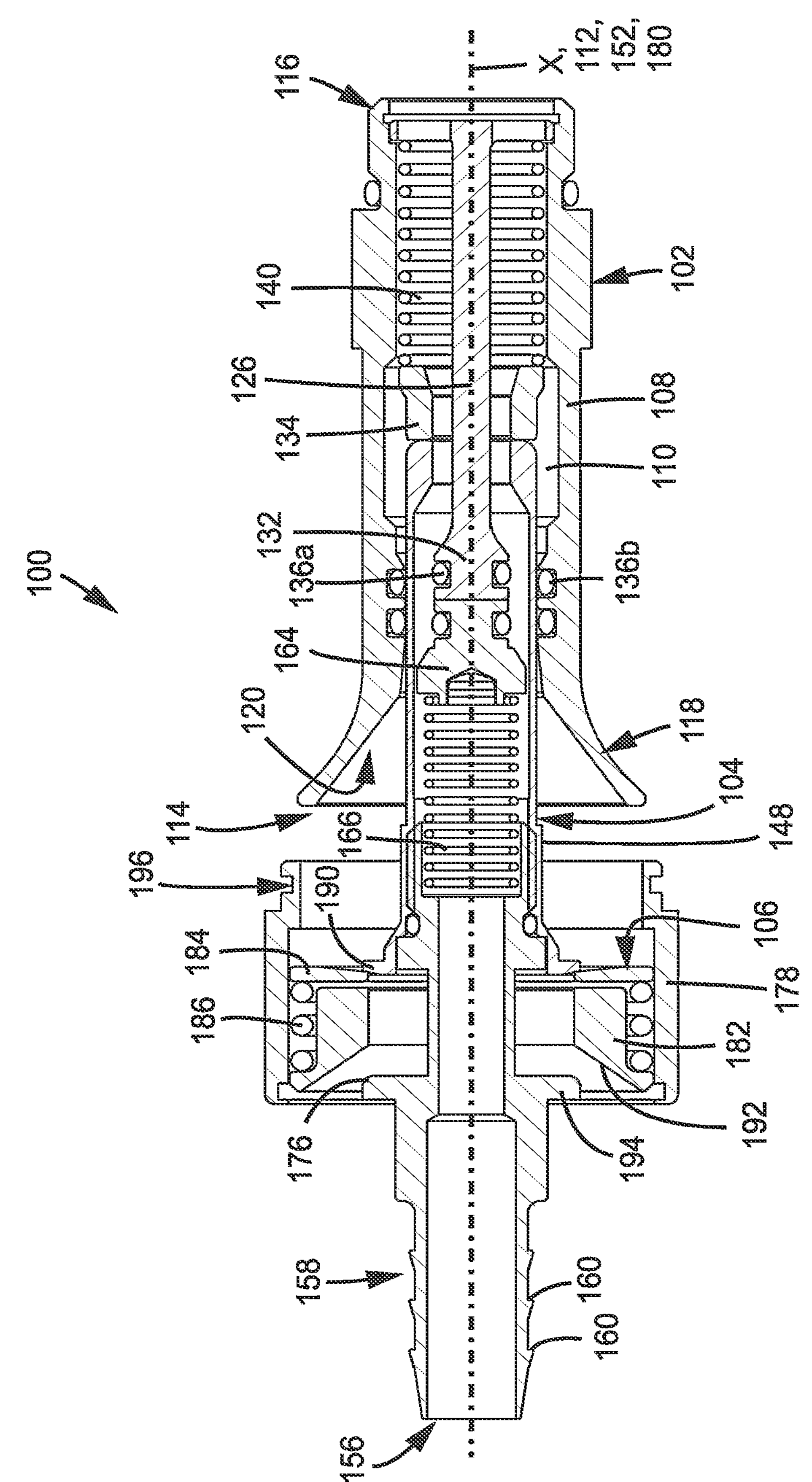

The compensation sleeve 182 and the compensation ring 184 can be axially movable relative to one another between an extended state (see FIG. 10) in which the compensation ring 184 is axially spaced from the compensation sleeve 182 and a compressed state (see FIG. 14) in which the compensation ring 184 is engaged with the compensation sleeve 182. The compensation spring 186 can be configured to bias the compensation sleeve 182 and the compensation ring 184 toward the extended state. The axial movement of the male valve body 148 relative to the valve mounting housing 178 is accommodated by movement of the compensation ring 184 and the compensation sleeve 182 between the expanded and compressed states.

In certain examples, the alignment compensation arrangement 106 includes a tapered interface that causes the compensation spring to bias the male valve body 148 toward a centered position in which the central male valve body axis 152 is co-axially aligned with the central mounting housing axis 180. The tapered interface can include a first tapered surface 188 defined by the compensation ring 184 that engages the first contact surface 174 of the male valve body 148. The first contact surface 174 of the male valve body 148 can be defined by a first annular flange 190 of the male valve body 148. The first contact surface 174 of the male valve body 148 faces toward the hose connection end 156 of the male valve body 148. In certain examples, the tapered interface between the first tapered surface 188 and the first contact surface 174 forms a nested conical taper spanning 360 degrees. That is, the front end of the compensation ring 184 can have a taper angle in the form of a conical recess and the first contact surface 174 of the male valve body 148 defines a conical shape that has a taper angle that matches the taper angle of the conical recess of the compensation ring 184.

The tapered interface of the alignment compensation arrangement 106 also includes a second tapered surface 192 defined by the compensation sleeve 182 that engages the second contact surface 176 of the male valve body 148. The second contact surface 176 of the male valve body 148 is defined by a second annular flange 194 of the male connector body 148. The second contact surface 176 of the second annular flange 194 faces toward the valved end 154 of the male valve body 148. The second tapered surface 192 of the compensation sleeve 182 and the second contact surface 176 of the second annular flange 194 can also form a nested conical taper spanning 360 degrees. That is, the back end of the compensation sleeve 182 can have a taper angle in the form of a conical recess and the corresponding second contact surface 176 of the male valve body 148 can define a conical shape that has a taper angle that matches the taper angle of the conical recess of the compensation sleeve 182 to form the nested conical taper. In other examples, the taper surfaces can be rounded.

The tapered interface of the alignment compensation arrangement 106 can also cause the compensation sleeve 182 and the compensation ring 184 to be moved axially toward one another when the male valve body 148 is forced to be angularly or translationally displaced relative to the centered position (i.e., the neutral position in which the reference axis 180 and the valve body axis 152 are co-axially aligned). The 360-degree nested tapers of the alignment compensation arrangement 106 provide a universal connection joint that allows the male valve body 148 to self-center regardless of orientation. That is, the alignment compensation arrangement 106 can universally center and universally pivot the male valve body 148 relative to the central mounting housing axis 180. The alignment compensation arrangement 106 can also provide the male valve body 148 with universal radial translation movement in all 360 degrees relative to the central mounting housing axis 180. The alignment compensation arrangement 106 allows the male valve body 148 to universally pivot in all 360 degrees relative to the central mounting housing axis 180. In certain examples, the alignment compensation arrangement 106 allows the male valve body 148 to pivot at least 5 degrees in all 360 degrees relative to the central mounting housing axis 180.

The valve mounting housing 178 can be provided with a slot 196 that allows the second fluid coupler 104 to be mounted to information technology equipment (e.g., the drawer 302). For example, the valve mounting housing 178 can be inserted into an opening defined in a wall 198 of the information technology equipment where a lock ring 200 can be utilized to lock the valve mounting housing 178 in place within the opening. That is, the lock ring 200 can snap over the valve mounting housing 178 into the slot 196 to lock the valve mounting housing 178 in place.

An alternative configuration of the male valve body 148 is provided at FIG. 5A, discussed in a later portion of this disclosure.

Figure 6:
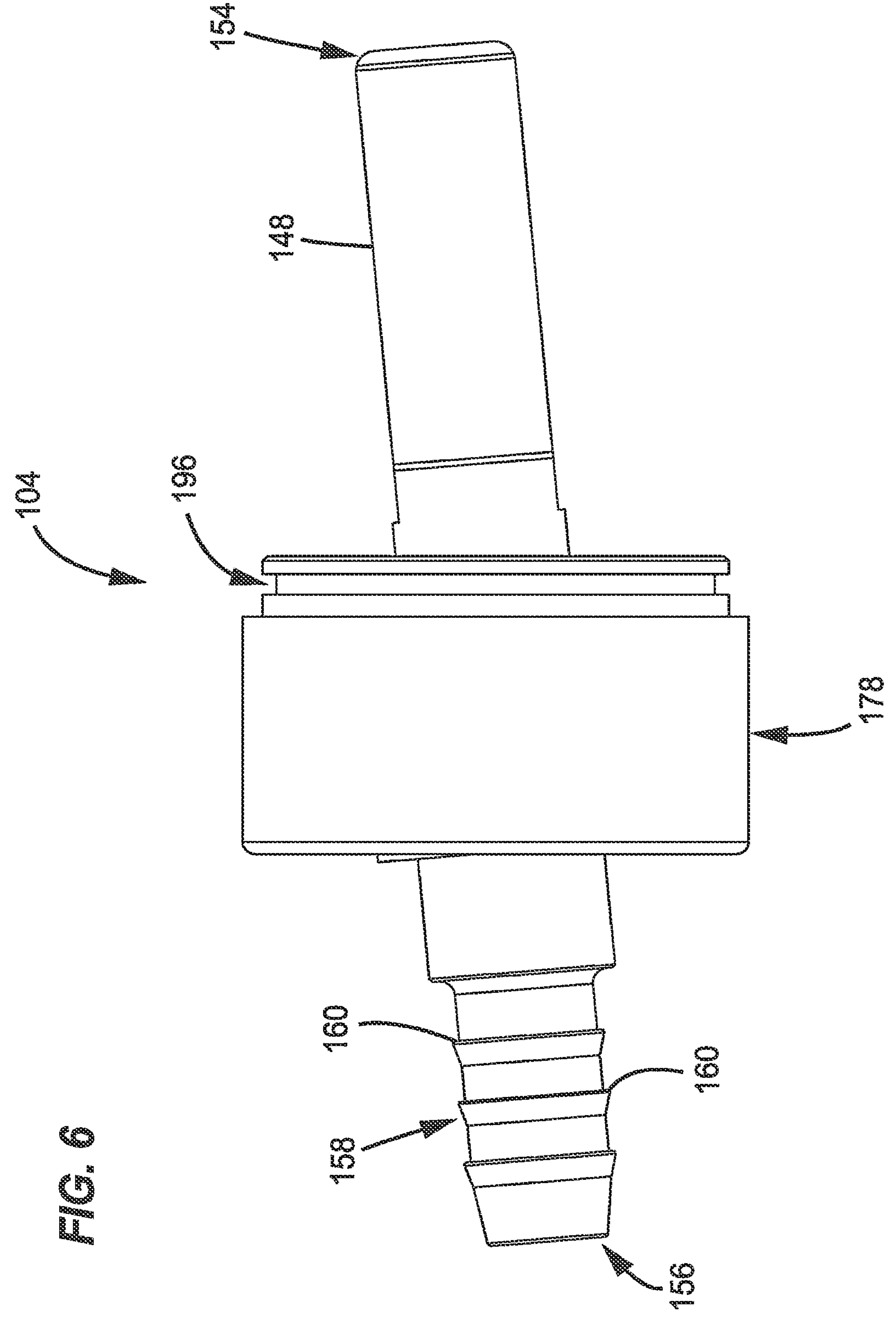
FIG. 6 illustrates a side view of the male fluid coupler of FIG. 3 in a pivoting position in accordance with the principles of the present disclosure.
Figure 7:
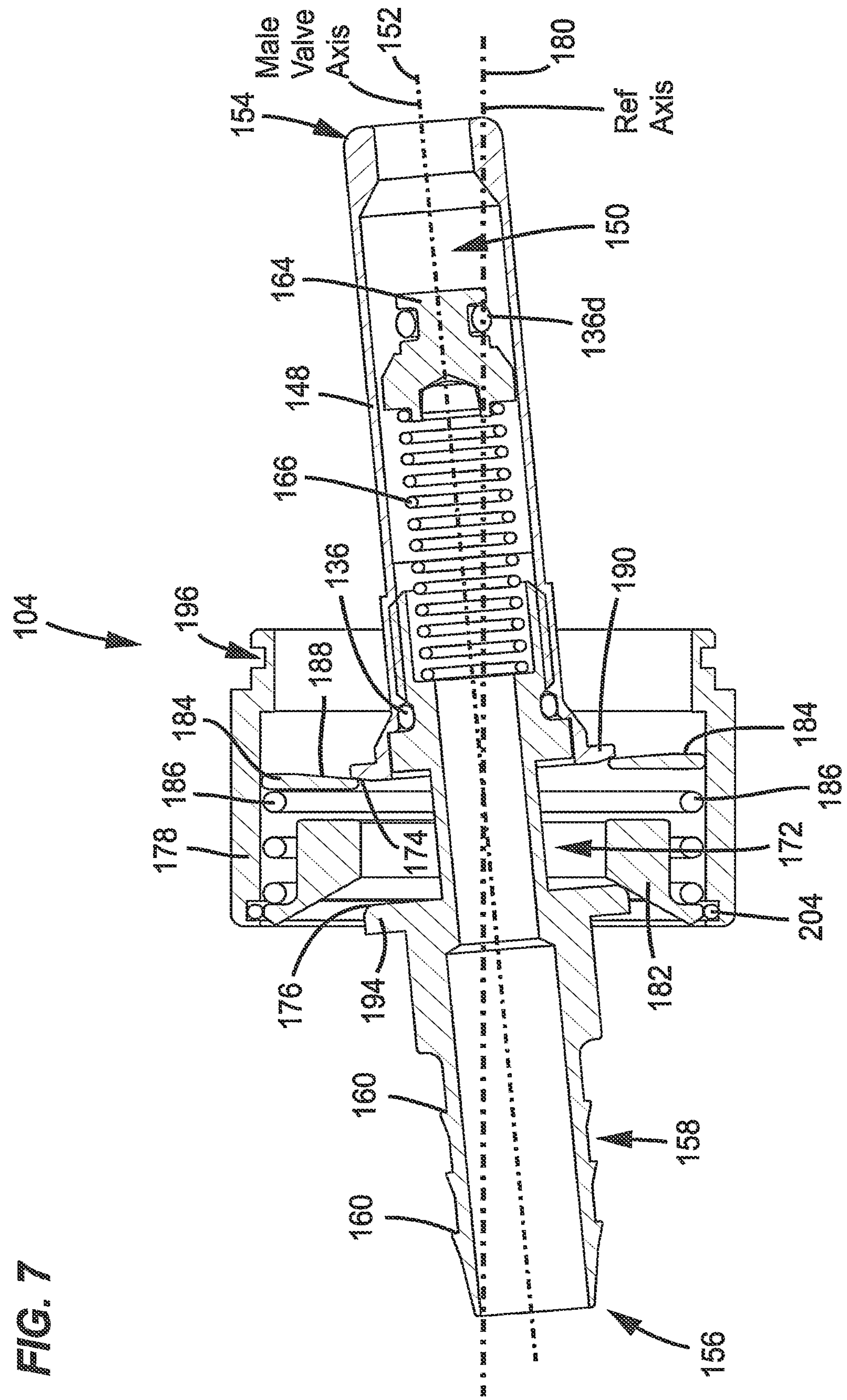
FIG. 7 illustrates a cross-sectional view of the male fluid coupler of FIG. 6.
Figure 8:
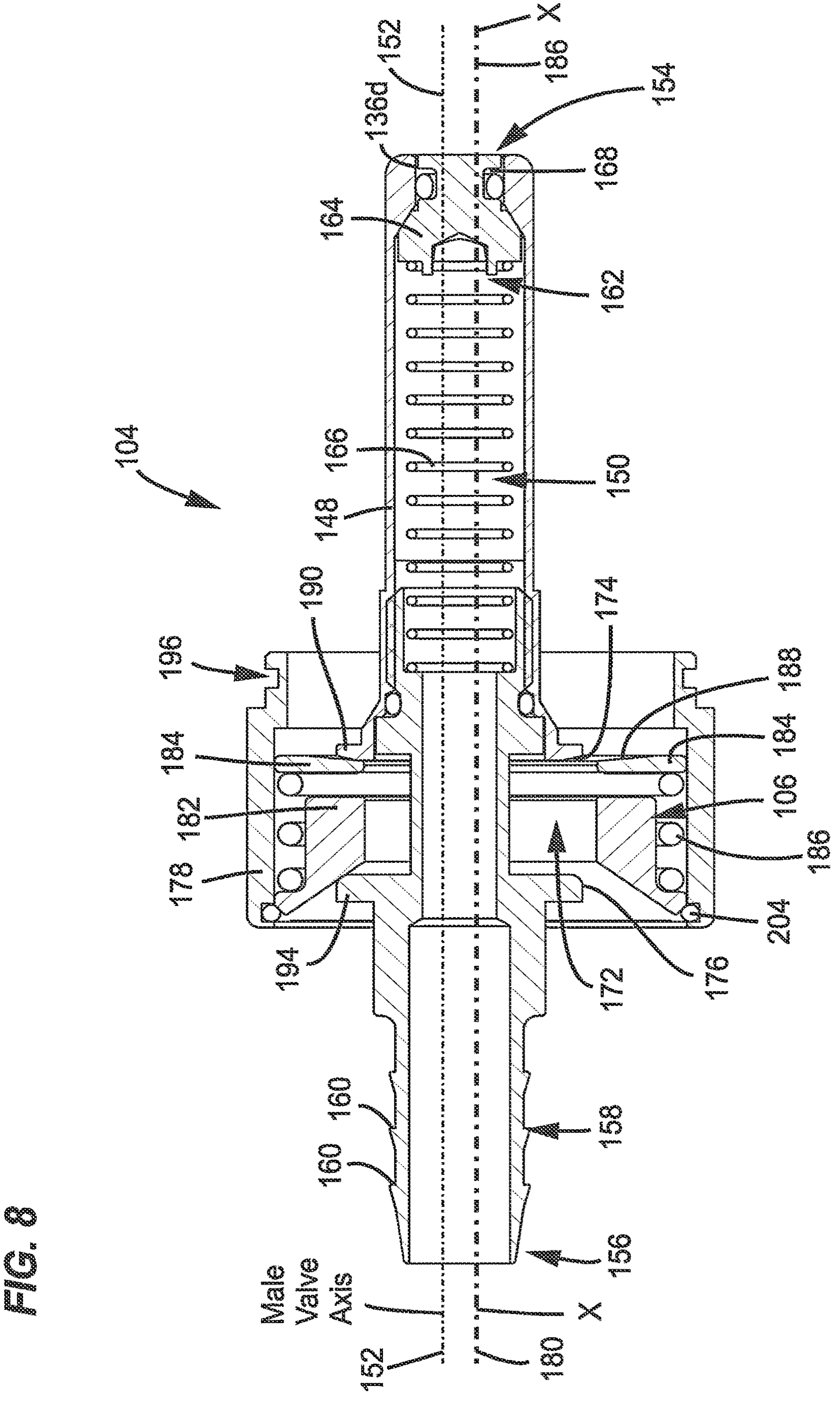
FIG. 8 illustrates a cross-sectional view of the male fluid coupler of FIG. 3 in a radially translated position in accordance with the principles of the present disclosure.
Figure 9:
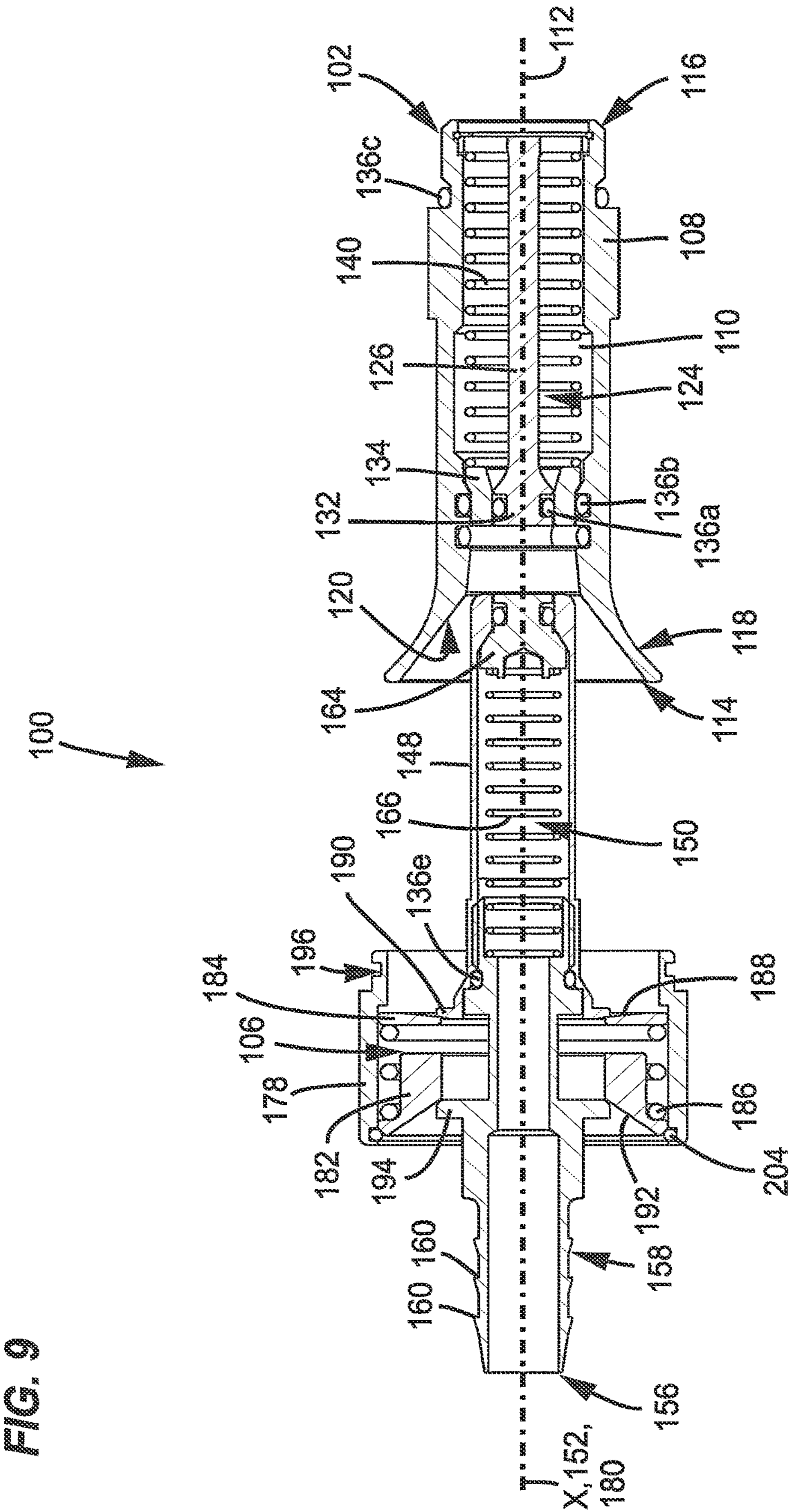
FIGS. 9-14 illustrate multiple cross-sectional views showing a sequence of coupling the male and female fluid couplers of FIG. 1.

Turning to FIGS. 6-8, the compensation sleeve 182 and the compensation ring 184 can be accommodated in the outer annular compensation recess 172 of the male valve body 148 to allow pivotal and radial translation movement of the male valve body 148 during mating of the first and second fluid couplers 102, 104. The compensation recess 184 can have a radial depth that is large enough to accommodate 5.25 millimeters (mm) of translational movement (see FIG. 8) of the male valve body 148 from the centered position in 360 degrees about the central mounting housing axis 180. Thus, in certain examples, Z (see FIG. 15) is at least 5.25 mm. In certain examples, Y (see FIG. 15) is at least 5 degrees. In certain examples, the compensation sleeve 182 contacts the interior of the valve mounting housing 178 at an annual contact region 179 having a relatively short axial length selected to allow the compensation sleeve 182 to universally tilt at least 5 degrees in all directions about the axis 180 of the valve mounting sleeve 178. In this way, when the compensation sleeve 182 and the compensation ring 184 are in the compressed state, the male valve body 145 can still be universally pivoted at least 5 degrees in all direction about the axis 180 of the valve mounting housing 18. In one example, the contact region 179 is at one end of the compensation sleeve 182 adjacent the end of the valve mounting sleeve 178 furthest from the valved end 154 of the male valve body 148.

In one example, the maximum distance the male valve body 148 can move axially relative to the valve mounting housing 178 of the alignment compensation arrangement 106 is 4.5 mm or less. That is, the male valve body 148 can tilt or move radially as needed within the stroke length of 4.5 mm or less to adjust for any misalignment between the central male valve body axis 152 and the central female valve body axis 112. The axial movement of the male valve body 148 relative to the valve mounting housing 178 is accommodated by movement of the compensation ring 184 and the compensation sleeve 182 between the expanded and compressed states.

FIGS. 9-14 illustrate a full sequence operation for mating the first and second fluid couplers 102, 104 together to form a connection that allows liquid to flow through the first and second fluid couplers 102, 104 without leaking.

When the first and second fluid couplers 102, 104 are inserted together, the valved end 154 of the male connector body 148 can be guided into the female valve body channel 100 by the funnel 120 of the female valve body 108. The alignment compensation arrangement 106 compensates for angular and radial misalignments between the central male valve body axis 152 and the central female valve body axis 112 that may exist before the first and second fluid couplers 102, 104 are inserted together.

During insertion of the first and second fluid couplers 102, 104 together, contact between the valved end 154 of the male valve body 148 and the valve sleeve 134 within the female valve body channel 110 moves the valve sleeve 134 from the closed position to the open position. Furthermore, contact between the valve stem 124 and the valve member 164 moves the valve member 164 from the closed position to the open position. As the second fluid coupler 104 is inserted into the first fluid coupler 102, the valve member 164 starts to move to the left against the force of the second valve spring 166 toward the hose connection end 156 of the male valve body 148. At the same time, the valved end 154 of the male valve body 148 engages the valve sleeve 134 and moves the valve sleeve 134 to the right (as shown in FIG.) against the force of the first valve spring 140. When the first and second fluid couplers 102, 104 are in the coupled position as shown in FIG. 14, a path of fluid flow is provided through the female valve body channel 110 and the male valve body channel 150. When in this position, both the valve sleeve 134 and the valve member 164 are in their open positions.

In certain examples, the male valve body 148 can be universally pivoted and universally radially translated relative to the central mounting housing axis 180 depending upon the mating alignment compensation needed between the central male valve body axis 152 and the central female valve body axis 112. Accordingly, the valve sleeve 134 and the valve member 164 can be moved to the open position.

In certain examples, when the compensation sleeve 182 and the compensation ring 184 are in the compressed state as shown in FIG. 14, the compensation sleeve 182 can pivot relative to the valve mounting housing 178 to accommodate angular mismatch of at least 5 degrees universally between the central male valve body axis 152 and the central mounting housing axis 180.

The valve mounting housing 178 defines an inner stop shoulder 202 (see FIG. 5) for stopping axial movement of the compensation ring 184 in a direction toward the valved end 154 of the male valve body 148. The compensation sleeve 182 can be retained in the valve mounting housing 178 by a retaining ring 204 (see FIG. 5) that stops axial movement of the compensation sleeve 182 in a direction toward the hose connection end 156 of the male valve body 148.

When the first and second fluid couplers 102, 104 are uncoupled, both the valve member 164 and the valve sleeve 134 move under forces of their respective springs 140, 166 to the closed position shown in FIG. 4.

A fluid coupler can have a valve body that defines a valve body axis, a valve arrangement for opening and closing fluid flow through the valve body and a valve mounting housing in which the valve body is mounted via an alignment compensation arrangement. The valve mounting housing defines a central mounting housing axis.

The alignment compensation arrangement includes a compensation sleeve, a compensation ring, and a compensation spring mounted within the valve mounting housing. The compensation spring can be configured to bias the compensation sleeve and the compensation ring axially apart from one another. The valve body of the fluid coupler can extend through the compensation sleeve and compensation ring such that the compensation sleeve and the compensation ring are positioned radially between the valve mounting housing and the valve body. The alignment compensation arrangement can be movable within the valve mounting housing between an extended state and a compressed state.

The compensation ring can be spaced axially further from the compensation sleeve when the alignment compensation arrangement is in in the extended state as compared to the contracted state. The compensation spring biases the alignment compensation arrangement toward the extended state.

A tapered interface can be defined between the valve body and at least one of the compensation sleeve and the compensation ring. The tapered interface can include nested tapers. In certain examples, the tapered interface includes nested conical tapers. The tapered interface automatically positions valve body in a centered position in which the valve body axis and the central mounting housing are co-axially aligned when the alignment compensation arrangement moves to the extended state. The tapered interface causes the compensation sleeve and the compensation ring to be moved axially toward one another when a tilt load or radial translation load is applied to the valve body thereby allowing the valve body to be angularly displaced or radially translated relative to a centered position.

The axial movement of the valve body relative to the valve mounting housing can be accommodated by movement of the compensation ring and the compensation sleeve between the expanded and compressed states. The alignment compensation arrangement can allow the valve body to be angled universally relative to the valve mounting housing and to be radially translated universally relative to the valve mounting housing. The alignment compensation arrangement can also allow the valve body to be angled universally relative to the valve mounting housing and to be radially translated universally relative to the valve mounting housing.

The compensation sleeve, the compensation ring and the compensation spring are co-axially aligned with respect to the central mounting housing axis and are positioned radially between the valve body and a cylindrical inner surface of the valve mounting housing. The compensation sleeve includes an outer annular flange that contacts an inner cylindrical surface of the valve mounting housing. The annular flange can allow the compensation sleeve to pivot at least 5 degrees relative to the valve mounting housing universally about the central mounting housing axis, although alternatives are possible.

The valve body of the fluid coupler can include an outer annular compensation recess defined between a first contact surface and a second contact surface, and the compensation sleeve and the compensation ring can be captured between the first and second contact surfaces of the valve body.

The tapered interface can include a first tapered surface defined by the compensation ring that engages the first contact surface of the valve body and a second tapered surface defined by the compensation sleeve that engages the second contact surface of the valve body.

The valve body projects forwardly from a front end of the valve mounting housing. The compensation sleeve is positioned at a rear end of the valve mounting housing and the compensation ring is positioned axially between compensation sleeve and the front end of the valve mounting housing. The compensation sleeve can be axially longer than the compensation ring.

The compensation spring can fit over a forward portion of the compensation sleeve and abut against the outer annular flange of the compensation sleeve. When the valve body is forced rearwardly relative to the valve mounting housing, the first contact surface of the valve body contacts the first tapered surface of the compensation ring thereby moving the compensation ring rearwardly toward the compensation sleeve against the bias of the compression spring such that the alignment compensation arrangement moves from the extended state toward the compressed state. The valve body and the compensation ring move relative to the compensation sleeve as the valve body is forced rearwardly relative to the valve mounting housing. The first tapered surface defines a first conical recess that faces in a forward direction and the second tapered surface defines a second conical recess that faces in a rearward direction.

Referring to FIG. 5A, the first fluid coupler 102 is illustrated as being provided with additional features that enable for smoother disconnection of the coupling parts, as discussed below. As the fluid coupler 102 of FIG. 5A is largely similar to the fluid coupler 102 of FIGS. 1 to 14, the description of the fluid coupler 102 of FIGS. 1 to 14 is fully applicable for the fluid coupler 102 of FIG. 5A. Accordingly, these aspects need not be repeated here. Instead, the description will focus on the primary differences provided with the fluid coupler 102 of FIG. 5A. One such difference is that the compensation sleeve 182 is provided with an inner surface 182*a* that is disposed at an oblique angle a1 with respect to the longitudinal axis X, 152 such that the inner surface 182*a* diverges away from the axis in a direction from the hose connection end 156 towards the valved end 154. Accordingly, the surface 182*a* increases the dimension and clearance of the outer annular compensation recess 172 in a direction towards the valved end 154. In some examples, the angle a1 is equal to or greater than the maximum offset angle of the male valve body 148 with respect to the housing 178, for example equal to or greater than 5 degrees. In the particular example shown, the angle a1 is about 12.5 degrees. In some configurations, when the male coupler 100 is moved to an offset position, the sleeve 182 tends to be pushed inside such that the sleeve part 182 causes an interference that does not allow for a full offset condition, and thus creates binding condition during connection or disconnection. The arrangement shown at FIG. 5A advantageously avoids such a dynamic. In another aspect, the valve mounting housing 178 defines a surface 208 that is provided as a chamfered surface at an oblique angle to the longitudinal axis X while the flange 190 is provided with a complementarily angled surface 190*a*. These surfaces facilitate smooth disconnection by removing any directly restricting surface that would otherwise prevent or inhibit disconnection. In yet another aspect, an annular space or groove 208 is defined between the inner stop surface 202 and the surface 206 of the housing 178. This feature also enhances and enables smooth disconnection. During a fast disconnection, the entire centering mechanism moves forward at higher speed and the male valve body 148 creates a tangential contact on the sleeve 182, and subsequently creates a biasing force. As such, the male valve body 148 can be pulled out in misaligned state and hence could get locked without the provision of the annular space or groove 208.

Although the above configurations provide certain advantages, the disclosure is not limited to only the disclosed embodiments and alternative arrangements are possible without departing from the concepts presented herein. For example, the compensation sleeve 182 and the housing 178 could be provided as a one-piece design rather than being provided as separate components. In another example, a mechanical washer could be provided and arranged within the housing 178 such that the load from the spring 186 acts upon the mechanical washer instead of the compensation sleeve 182. With such an embodiment, the spring 186 would act upon the compensation ring 184 without acting on the compensation sleeve 182.

Example Aspects of the Disclosure

Aspect 1 A blind mate coupling assembly for a fluid line, the blind mate coupling comprising:

first and second fluid couplers adapted to be coupled together to provide a fluid connection between the first and second fluid couplers;

the first fluid coupler including:

a female valve body having a female valve body channel defining a central female valve body axis, the female valve body channel extending longitudinally along the central female valve body axis from a first end of the female valve body to a second end of the female valve body; and a first valve arrangement for opening and closing fluid flow through the female valve body channel, the first valve arrangement including a valve stem aligned along the central female valve body axis and axially fixed with respect to the female valve body, the valve stem including a stem body with a fixed valve head, the first valve arrangement further including a valve sleeve within the female valve body channel that is axially movable relative to the fixed valve head and the female valve body between a closed position in which the valve sleeve cooperates with the valve head to prevent fluid flow through the female valve body channel and an open position in which fluid flow is permitted though the female valve body channel;

the second fluid coupler including:

a male valve body having a male valve body channel defining a central male valve body axis, the male valve body channel extending longitudinally along the central male valve body axis from a valved end of the male valve body to a hose connection end of the male valve body;

a second valve arrangement for opening and closing fluid flow through the male valve body channel, the second valve arrangement including a valve member within the male valve body channel that is axially movable relative to the male valve body between a closed position in which the valve member prevents fluid flow through the male valve body channel and an open position in which fluid flow is permitted though the male valve body channel; and a valve mounting housing in which the male valve body is mounted via an alignment compensation arrangement, the valve mounting housing defining a central mounting housing axis, the alignment compensation arrangement including a compensation sleeve, a compensation ring, and a compensation spring that biases the compensation sleeve and the compensation ring axially apart from one another, the alignment compensation arrangement further including a tapered interface that causes the compensation sleeve and the compensation ring to be moved axially toward one another when the male valve body is forced to be angularly or translationally displaced relative to a centered position;

wherein the alignment compensation arrangement compensates for angular and radial misalignments between the central male valve body axis and the central female valve body axis that exist before the first and second fluid couplers are inserted together; and wherein during insertion of the first and second fluid couplers together, contact between the valved end of the male valve body and the valve sleeve moves the valve sleeve from the closed position to the open position and contact between the valve stem and the valve member moves the valve member from the closed position to the open position.

Aspect 2. The blind mate coupling assembly of aspect 1, wherein the first end of the female valve body defining an alignment funnel for guiding the second fluid coupler toward alignment with the central female valve body axis when the first and second fluid couplers are inserted together.

Aspect 3. The blind mate coupling assembly of aspect 1 or 2, wherein the stem body further includes a base end fixed with respect to the female valve body adjacent the second end of the female valve body, wherein the fixed valve head is positioned at a free end opposite the base end.

Aspect 4. The blind mate coupling assembly of any of aspects 1-3, wherein the first valve arrangement further includes a first valve spring positioned about the stem body for biasing the valve sleeve toward the first end of the female valve body and toward the closed position.

Aspect 5. The blind mate coupling assembly of aspect 4, wherein the valve member is spring biased toward the valved end of the male valve body and the closed position by a second valve spring.

Aspect 6. The blind mate coupling assembly of aspect 5, wherein the male valve body includes an outer annular compensation recess defined between a first contact surface and a second contact surface, wherein the first contact surface is closer to the valved end of the male valve body and the second contact surface is closer to the hose connection end of the male valve body.

Aspect 7. The blind mate coupling assembly of aspect 6, wherein the compensation sleeve, the compensation ring and the compensation spring are co-axially aligned with respect to the central mounting housing axis and are positioned radially between the male valve body and the valve mounting housing.

Aspect 8. The blind mate coupling assembly of aspect 6 or 7, wherein the compensation sleeve and the compensation ring are axially movable relative to one another between an extended state in which the compensation ring is axially spaced from the compensation sleeve and a compressed state in which the compensation ring engages the compensation sleeve.

Aspect 9. The blind mate coupling assembly of any of aspects 6-8, wherein the compensation spring is configured to bias the compensation sleeve and the compensation ring toward the extended state, and wherein the compensation sleeve and the compensation ring are captured between the first and second contact surfaces of the male valve body.

Aspect 10. The blind mate coupling assembly of aspect 6, wherein the tapered interface includes a first tapered surface defined by the compensation ring that engages the first contact surface of the male valve body and a second tapered surface defined by the compensation sleeve that engages the second contact surface of the male valve body.

Aspect 11. The blind mate coupling assembly of aspect 6, wherein the tapered interface causes the compensation spring to bias the male valve body toward the centered position in which the central male valve body axis is co-axially aligned with the central mounting housing axis.

Aspect 12. The blind mate coupling assembly of aspect 6, wherein the compensation sleeve and the compensation ring are accommodated in the outer annular compensation recess of the male valve body to allow pivotal and radial translation movement of the male valve body.

Aspect 13. The blind mate coupling assembly of aspect 8, wherein axial movement of the male valve body relative to the valve mounting housing is accommodated by movement of the compensation ring and the compensation sleeve between the expanded and compressed states.

Aspect 14. The blind mate coupling assembly of aspect 2, wherein when the first and second fluid couplers are inserted together, the valved end of the male connector body is guided into the female valve body channel by the alignment funnel of the female valve body.

Aspect 15. A male fluid coupler comprising:

a male valve body having a male valve body channel defining a central male valve body axis, the male valve body channel extending longitudinally along the central male valve body axis from a valved end of the male valve body to a hose connection end of the male valve body;

a valve arrangement for opening and closing fluid flow through the male valve body channel, the valve arrangement including a valve member within the male valve body channel that is axially movable relative to the male valve body between a closed position in which the valve member prevents fluid flow through the male valve body channel and an open position in which fluid flow is permitted though the male valve body channel; and a valve mounting housing in which the male valve body is mounted via an alignment compensation arrangement, the valve mounting housing defining a central mounting housing axis, the alignment compensation arrangement including a compensation sleeve, a compensation ring, and a compensation spring that biases the compensation sleeve and the compensation ring axially apart from one another, the alignment compensation arrangement further including a tapered interface that causes the compensation sleeve and the compensation ring to be moved axially toward one another when the male valve body is forced to be angularly or translationally displaced relative to a centered position.

Aspect 16. The male fluid coupler of aspect 15, wherein the male valve body is configured to mate with a female fluid coupler that defines a central female valve body axis.

Aspect 17. The male fluid coupler of aspect 16, wherein the alignment compensation arrangement compensates for angular and radial misalignments between the central male valve body axis and the central female valve body axis that exist before the male and female fluid couplers are inserted together.

Aspect 18. The male fluid coupler of aspect 15, wherein the male valve body moves axially relative to the valve mounting housing of the alignment compensation arrangement about 4.5 mm.

Aspect 19. The male fluid coupler of aspect 15, wherein the compensation ring universally pivots relative to the valve mounting housing to accommodate angular mismatch of about 5 degrees between the central male valve body axis and the central mounting housing axis.

Aspect 20. The male fluid coupler of aspect 15, wherein the alignment compensation arrangement provides the male valve body with universal radial translation movement in all 360 degrees relative to the central mounting housing axis.

Various modifications and alterations of this disclosure will become apparent to those skilled in the art without departing from the scope and spirit of this disclosure, and it should be understood that the inventive scope of this disclosure is not to be unduly limited to the illustrative embodiments set forth herein.

What is claimed is:

1. A fluid coupler, comprising:

a valve body defining a valve body axis;

a valve arrangement for opening and closing fluid flow through the valve body;

a valve mounting housing in which the valve body is mounted via an alignment compensation arrangement movable within the valve mounting housing, the valve mounting housing including a front end and a back end opposite the front end, the valve mounting housing defining a central mounting housing axis extending through the front end and the back end, the alignment compensation arrangement including:

a spring positioned within the valve mounting housing and biasing the valve body towards the front end and away from the back end; and a tapered interface surface configured to interface with the valve body within the valve mounting housing, the tapered interface surface being positioned behind the spring, wherein the alignment compensation arrangement biases the valve body into an aligned position in which the valve body axis is coaxially aligned with the central mounting housing axis and enables the valve body to be axially displaced, angularly displaced, and radially translated relative to the valve mounting housing while the valve body remains interfaced with the tapered interface surface.

2. The fluid coupler of claim 1, wherein the alignment compensation arrangement includes a compensation sleeve mounted within the valve mounting housing; and wherein the alignment compensation arrangement includes the tapered interface surface.

3. The fluid coupler of claim 2, wherein the alignment compensation arrangement includes another tapered interface surface configured to interface with the valve body within the valve mounting housing.

4. The fluid coupler of claim 3, wherein the another tapered interface surface is positioned in front of the spring.

5. The fluid coupler of claim 4, wherein the alignment compensation arrangement includes a compensation ring mounted within the valve mounting housing and positioned in front of the spring; and wherein the compensation ring includes the another tapered interface surface.

6. The fluid coupler of claim 3, wherein the alignment compensation arrangement includes a compensation ring mounted within the valve mounting housing; and wherein the compensation ring includes the another tapered interface surface.

7. The fluid coupler of claim 1, wherein the alignment compensation arrangement includes another tapered interface surface configured to interface with the valve body within the valve mounting housing.

8. The fluid coupler of claim 7, wherein the another tapered interface surface is positioned in front of the spring.

9. The fluid coupler of claim 8, wherein the valve body forms a nested tapered interface with the another tapered interface surface.

10. The fluid coupler of claim 9, wherein the nested tapered interface is conical.

11. The fluid coupler of claim 7, wherein the alignment compensation arrangement includes a compensation ring mounted within the valve mounting housing and positioned in front of the spring; and wherein the compensation ring includes the another tapered interface surface.

12. The fluid coupler of claim 1, wherein the tapered interface surface faces the back end of the valve mounting housing.

13. The fluid coupler of claim 1, wherein the valve body includes a hose connector that extends through the back end of the valve mounting housing.

14. A fluid coupler assembly, comprising:

the fluid coupler of claim 1; and another fluid coupler configured to mate with the fluid coupler to allow fluid to flow through the fluid coupler and the another fluid coupler.

15. The fluid coupler assembly of claim 14, wherein the another fluid coupler includes another valve arrangement configured to interface with the valve arrangement when the fluid coupler and the another fluid coupler are mated to each other.

16. The fluid coupler assembly of claim 15, wherein the another valve arrangement includes a first valve spring.

17. The fluid coupler assembly of claim 16, wherein the valve arrangement includes a second valve spring.

18. The fluid coupler of claim 1, wherein the valve arrangement includes a valve spring and a valve member, the valve spring biasing the valve member.

19. A fluid coupler, comprising:

a valve body defining a valve body axis;

a valve arrangement for opening and closing fluid flow through the valve body;

a valve mounting housing in which the valve body is mounted via an alignment compensation arrangement movable within the valve mounting housing, the valve mounting housing including a front end and a back end opposite the front end, the valve mounting housing defining a central mounting housing axis extending through the front end and the back end, the alignment compensation arrangement including:

a spring positioned within the valve mounting housing and biasing the valve body towards the front end and away from the back end; and a tapered interface surface configured to interface with the valve body within the valve mounting housing, the tapered interface surface being positioned behind the spring, wherein the alignment compensation arrangement biases the valve body into an aligned position in which the valve body axis is coaxially aligned with the central mounting housing axis and enables the valve body to be axially displaced, angularly displaced, and radially translated relative to the valve mounting housing, wherein the alignment compensation arrangement includes another tapered interface surface configured to interface with the valve body within the valve mounting housing;

wherein the another tapered interface surface is positioned in front of the spring;

wherein the tapered interface surface faces the back end of the valve mounting housing; and wherein the another tapered interface surface faces the front end of the valve mounting housing.

20. A fluid coupler, comprising:

a valve body defining a valve body axis;

a valve arrangement for opening and closing fluid flow through the valve body;

a valve mounting housing in which the valve body is mounted via an alignment compensation arrangement movable within the valve mounting housing, the valve mounting housing including a front end and a back end opposite the front end, the valve mounting housing defining a central mounting housing axis extending through the front end and the back end, the alignment compensation arrangement including:

a spring positioned within the valve mounting housing and biasing the valve body towards the front end and away from the back end; and a tapered interface surface configured to interface with the valve body within the valve mounting housing, the tapered interface surface being positioned behind the spring, wherein the alignment compensation arrangement biases the valve body into an aligned position in which the valve body axis is coaxially aligned with the central mounting housing axis and enables the valve body to be axially displaced, angularly displaced, and radially translated relative to the valve mounting housing, wherein the alignment compensation arrangement includes another tapered interface surface configured to interface with the valve body within the valve mounting housing; and wherein the another interface surface faces the front end of the valve mounting housing.

* * * * *